(12) United States Patent
Kim

(10) Patent No.: US 8,045,363 B2
(45) Date of Patent: Oct. 25, 2011

(54) VARIABLE RESISTANCE MEMORY DEVICES INCLUDING ARRAYS OF DIFFERENT SIZES

(75) Inventor: Ho-Jung Kim, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 78 days.

(21) Appl. No.: 12/613,832

(22) Filed: Nov. 6, 2009

(65) Prior Publication Data

US 2010/0110770 A1  May 6, 2010

(30) Foreign Application Priority Data

Nov. 6, 2008 (KR) .................. 10-2008-0109872
Nov. 6, 2008 (KR) .................. 10-2008-0109945

(51) Int. Cl.
G11C 11/00 (2006.01)

(52) U.S. Cl. .................. 365/148; 365/158; 365/189.2

(58) Field of Classification Search .................. 365/100
See application file for complete search history.

(56) References Cited

U.S. PATENT DOCUMENTS

| 6,101,146 | A * | 8/2000 | Maesako et al. | 365/230.03 |
| 7,830,732 | B2 * | 11/2010 | Moshayedi et al. | 365/189.2 |
| 7,952,956 | B2 * | 5/2011 | Wang et al. | 365/230.09 |
| 2004/0027849 | A1 | 2/2004 | Yang et al. | |
| 2005/0058009 | A1 | 3/2005 | Yang et al. | |
| 2008/0080226 | A1 | 4/2008 | Mikolajick et al. | |

FOREIGN PATENT DOCUMENTS

| JP | 2006-351061 | 12/2006 |
| JP | 2008-112554 | 5/2008 |
| KR | 1020020062109 | 7/2002 |

* cited by examiner

Primary Examiner — Tan T. Nguyen
(74) Attorney, Agent, or Firm — Myers Bigel Sibley & Sajovec, P.A.

(57) ABSTRACT

A variable resistance memory device may include a first array of first variable resistance memory cells and a second array of second variable resistance memory cells on an integrated circuit chip. Each of the first variable resistance memory cells may be configured to store a first data value by maintaining a first electrical resistance and to store a second data value by maintaining a second electrical resistance. The first and second data values are different, and the second resistance is greater than the first resistance. Each of the second variable resistance memory cells may be configured to store the first data value by maintaining a third electrical resistance and to store the second data value by maintaining a fourth electrical resistance. The fourth resistance may be greater than the third resistance, and the third resistance may be less than the first resistance.

19 Claims, 33 Drawing Sheets

|  | Cell Size | Diode Spec | Cell R |
|---|---|---|---|
| High Density Array | 4F2 | 1sat = 10uA | On:2M, Off:20M |
| High Speed Array | 8F2 | 1sat = 100uA | On:200k, Off:2M |

|  | Cell Height | Diode Spec | Cell R |
|---|---|---|---|
| High Density Array | 5nm | 1sat = 10uA | On:2M, Off:20M |
| High Speed Array | 10nm | 1sat = 100uA | On:200k, Off:2M |

VARIABLE RESISTANCE MEMORY DEVICES INCLUDING ARRAYS OF DIFFERENT SIZES

This application claims priority from Korean Patent Application No. 10-2008-0109945 filed on Nov. 6, 2008 and from Korean Patent Application No. 10-2008-0109872 filed on Nov. 6, 2008 in the Korean Intellectual Property Office, the disclosures of which are incorporated herein by reference in their entirety.

BACKGROUND

1. Field of the Invention

The present invention relates to memories, and more particularly, to resistive memories.

2. Description of the Related Art

Examples of nonvolatile memories using resistance materials include resistive random access memories (RRAMs), phase-change random access memories (PRAMs), and magnetic RAMs (MRAMs). Dynamic RAMs (DRAMs) or flash memories store data using charges. Nonvolatile memories using resistance materials store data by changing the resistance of a variable resistance material (in the case of RRAMs), changing the state of a phase change material such as a chalcogenide alloy (in the case of PRAMs), or changing the resistance of a magnetic tunnel junction (MTJ) thin film according to a magnetization state of a ferromagnetic material (in the case of MRAMs), and the like.

A resistive memory cell includes a variable resistance material between an upper electrode and a lower electrode, and the resistance level of the variable resistance material varies according to a voltage applied to the upper and lower electrodes. Examples of such resistive memory cells are discussed in U.S Patent Publication Nos. 2005-58009 and 2004-27849, the disclosures of which are hereby incorporated herein in their entirety by reference. In particular, a filament that serves as a current path for a cell current is formed in the variable resistance material. A state in which a part of the filament is disconnected is defined as a reset state, a high resistance state, or reset data (data 1). A state in which the filament is connected is defined as a set state, a low resistance state, or set data (data 0).

A reset voltage having a voltage level, at which the filament may be disconnected, is supplied to write reset data into resistive memory cells. A set voltage having a voltage level, at which the filament may be reconnected, is supplied to write set data into the resistive memory cells. Further, a voltage having a low voltage level, at which the state of the filament does not change, is supplied to read stored data so as to determine whether the read data is reset data or set data.

SUMMARY

According to some embodiments of the present invention, a resistive memory chip may provide improved performance and/or may be manufactured at a lower cost.

According to some embodiments of the present invention, a resistive memory may include a first array including first variable resistive memory cells having a first resistance level which corresponds to first data or a second resistance level which corresponds to second data and is higher than the first resistance level. A second array may include second variable resistive memory cells having a third resistance level which corresponds to the first data and is lower than the first resistance level or a fourth resistance level which corresponds to the second data and is higher than the third resistance level.

According to other embodiments of the present invention, a resistive memory may include a high-density array, a high-speed array, and a memory interface. A first interface for accessing the high-density array and a second interface for accessing the high-speed array may be physically integrated into the memory interface.

According to still other embodiments of the present invention, a resistive memory may include a first memory and a second memory. The first memory may include a first array which includes a plurality of bitlines, a plurality of wordlines, and a plurality of resistive memory cells, each being coupled to one of the bitlines and one of the wordlines. The second memory may include a second array which includes a plurality of bitlines, a plurality of wordlines, and a plurality of resistive memory cells, each being coupled to one of the bitlines and one of the wordlines. The first array and the second array may have different sizes.

According to yet other embodiments of the present invention, a resistive memory chip may include a first array and a second array having a different size from the first array. A first interface for accessing the first array and a second interface for accessing the second array may be physically integrated into a memory interface.

According to some embodiments of the present invention, a variable resistance memory device may include a first array of first variable resistance memory cells and a second array of second variable resistance memory cells on an integrated circuit chip. Each of the first variable resistance memory cells may be configured to store a first data value by maintaining a first electrical resistance and to store a second data value by maintaining a second electrical resistance. The first and second data values are different, and the second resistance is greater than the first resistance. Each of the second variable resistance memory cells may be configured to store the first data value by maintaining a third electrical resistance and to store the second data value by maintaining a fourth electrical resistance. The fourth resistance may be greater than the third resistance, and the third resistance may be less than the first resistance.

According to other embodiments of the present invention, a variable resistance memory device may include a high-density array of first variable resistance memory cells and a high-speed array of second variable resistance memory cells on an integrated circuit chip. Each of the first variable resistance memory cells may have a first cell size, and each of the second variable resistance memory cells may have a second cell size different than the first cell size. A memory interface may include a first interface configured to access the high-density array and a second interface configured to access the high-speed array, and the first and second interfaces may be physically integrated in the memory interface.

According to still other embodiments of the present invention, a variable resistance memory device may include a first resistive memory array on an integrated circuit chip and a second resistive memory array on the integrated circuit chip. The first resistive memory array may include a first plurality of bitlines, a first plurality of wordlines, and a first plurality of variable resistance memory cells, and each of the variable resistance memory cells of the first plurality may be electrically coupled between one of the first plurality of bitlines and one of the first plurality of wordlines. The second resistive memory array may include a second plurality of bitlines, a second plurality of wordlines, and a second plurality of variable resistance memory cells, and each of the variable resistance memory cells of the second plurality may be electrically coupled between one of the second plurality of bitlines and one of the second plurality of wordlines. Moreover, the first and second resistive memory arrays may have different sizes.

According to yet other embodiments of the present invention, a variable resistance memory device may include a first array of first variable resistance memory cells on an integrated circuit chip and a second array of second variable resistance memory cells on the integrated circuit chip. Each of the first variable resistance memory cells may have a first size, and each of the second variable resistance memory cells may have a second size different than the first size. A memory interface on the integrated circuit chip may include a first interface configured to access the first array of the first variable resistance memory cells and a second interface configured to access the second array of the second variable resistance memory cells.

BRIEF DESCRIPTION OF THE DRAWINGS

The above and other aspects and features of the present invention will become more apparent by describing in detail examples of embodiments thereof with reference to the attached drawings, in which.

DETAILED DESCRIPTION OF THE EMBODIMENTS

Figure 1:
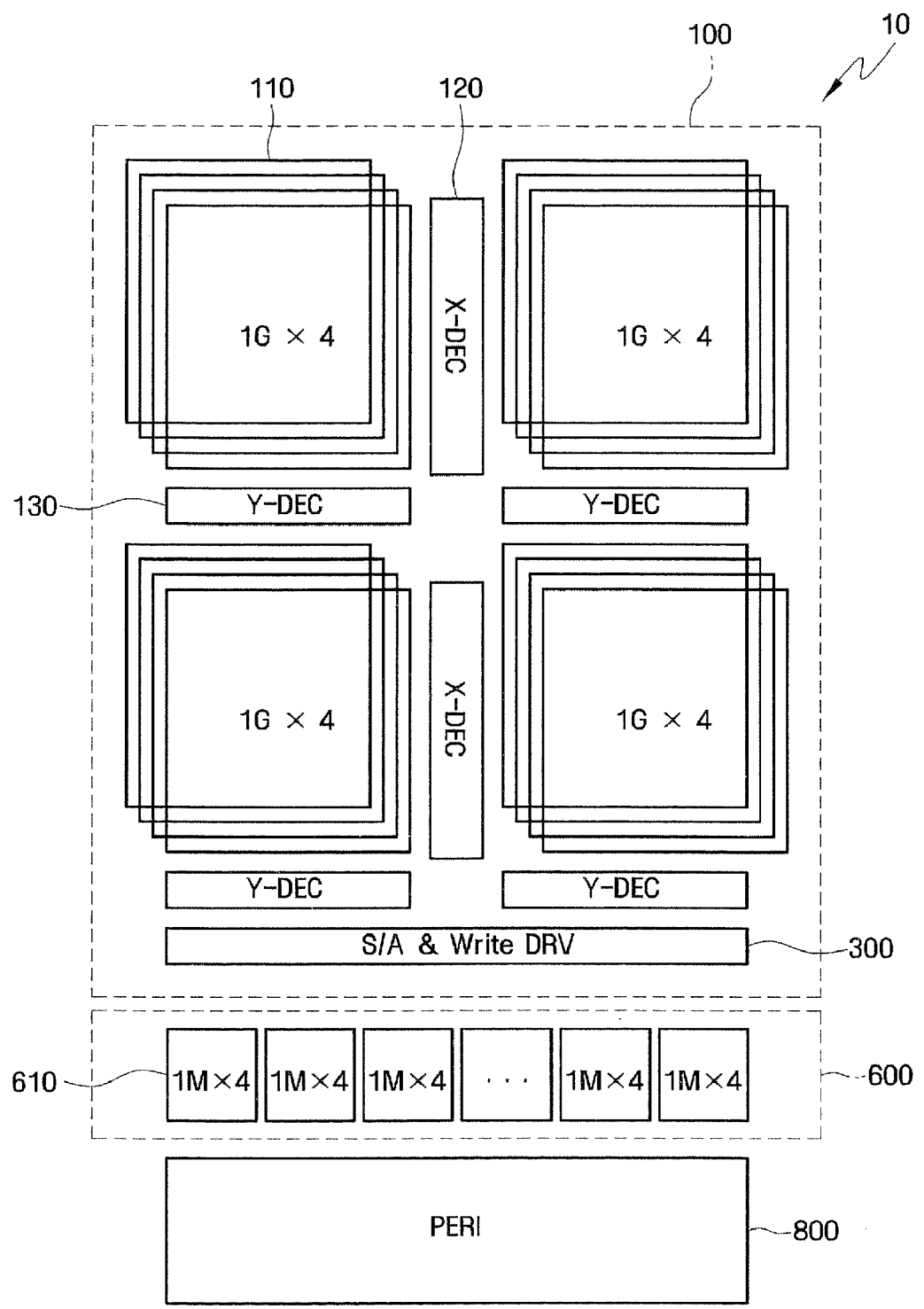
FIG. 1 is a block diagram of a resistive memory according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety as if set forth fully herein.

Figure 2:
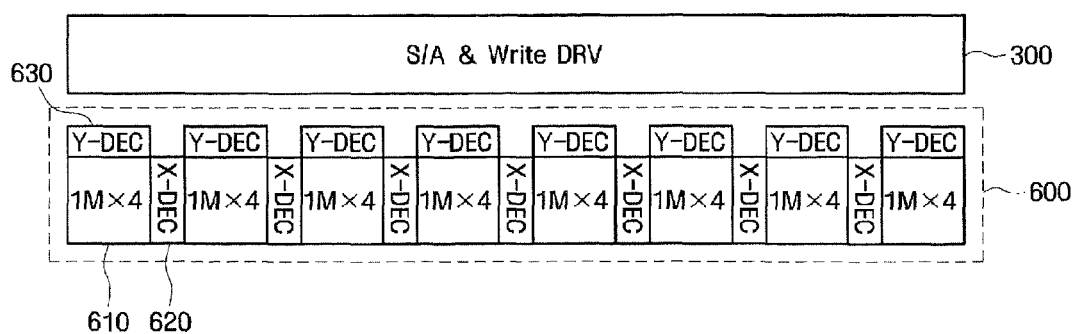
FIG. 2 is a block diagram of a random access memory (RAM) of FIG. 1.

FIG. 1 is a block diagram of a resistive memory chip 10 according to some embodiments of the present invention. FIG. 2 is a block diagram of a random access memory (RAM) 600 illustrated in FIG. 1. X-decoders 620 and Y-decoders 630 not shown in FIG. 1 are illustrated in FIG. 2.

In embodiments of the present invention, an "array" may be defined as a group of resistive memory cells, which is a minimum operational unit. A minimum operational unit may denote a minimum unit of cells that are activated to read or write data from/to the cells. Here, the term "activate" refers to applying a voltage to a wordline and a bitline. After an array of cells are activated, data can be read or written from/to the array of cells. An "array" may also be defined as a group of resistive memory cells that can be selected by any one X-decoder (indicated by reference numerals 120 and 620 respectively in FIGS. 1 and 2) and any one Y-decoder (indicated by reference numerals 130 and 630 respectively in FIGS. 1 and 2) to read or write data. For example, each resistive memory illustrated in FIG. 1 may include four arrays.

Referring to FIGS. 1 and 2, the resistive memory 10 (for example, provided on a semiconductor integrated circuit chip) may include storage memory 100, RAM 600, sense amp & write driver 300, and peripheral circuit region 800.

Resistive memory cells in the storage memory 100 may have different structures from those of resistive memory cells in RAM 600. That is, the single resistive memory 10 may include resistive memories (i.e., storage memory 100 and RAM 600) that have different cell structures according to different applications.

Storage memory 100 may include high-density arrays 110, X-decoders 120, and Y-decoders 130. High-density arrays 100 may store a high density of user data. Storage memory 100 may be implemented as, e.g., a NAND-type flash memory.

High-density arrays 110 as a whole may have a memory capacity of, e.g., 16 Gbits as illustrated in FIG. 1. For example, four 1-Gbit arrays may be stacked to form each of high-density arrays 110. Each of high-density arrays 110 may include first variable resistive memory cells having a first resistance level, which corresponds to first data, or a second resistance level which corresponds to second data and is higher than the first resistance level. High-density arrays 110 may have relatively high resistance levels corresponding to the first data and the second data, compared with high-speed arrays 610 which will be described later. Therefore, high-density arrays 110 may operate at a relatively low speed and thus may be used as a storage for user data.

Although not specifically illustrated in the drawings, each of the high-density arrays 110 may include a plurality of bitlines, a plurality of wordlines, and a plurality of resistive memory cells, and each of the resistive memory cells may be coupled to one of the bitlines and one of the wordlines.

Each of the resistive memory cells may include a variable resistance device having a different resistance level according to data and an access device controlling a cell current that flows through the variable resistance device. In the variable resistance device, a filament, which serves as a current path of the cell current, may be formed. A state in which a part of a filament is disconnected may be defined as reset data, and a state in which the filament is connected may be defined as set data. The variable resistance device may be made of a material such as NiO. In addition, the access device may be implemented as one of a field-effect transistor (FET), a diode, a PNP bipolar transistor, and/or an NPN bipolar transistor.

Each of the X-decoders 120 and each of the Y-decoders 130 respectively designate rows and columns of resistive memory cells. In so doing, each of X-decoders 120 and each of Y-decoders 130 select one or more resistive memory cells to be read or written from/to a plurality of resistive memory cells.

RAM 600 may include high-speed arrays 610, X-decoders 620, and Y-decoders 630. High-speed arrays 610 may store operating system (OS) data and code data. RAM 600 may be implemented as, e.g., NOR-type flash memory and/or dynamic random access memory (DRAM).

High-speed arrays 610 as a whole may have a memory capacity of e.g., 16 Mbits as illustrated in FIG. 1. For example, four 1-Mbit arrays may be stacked to form each of the high-speed arrays 610. High-speed arrays 610 have relatively low resistance levels corresponding to the first data and the second data, compared with high-density arrays 110. Therefore, high-speed arrays 610 may operate at a relatively high speed and thus may be used to store OS data and/or code data and/or used as a cache memory.

Each of high-speed arrays 610 may include a plurality of bitlines, a plurality of wordlines, and a plurality of resistive memory cells. The bitlines, the word lines, and the resistive memory cells of the high-speed arrays 610 may be substantially identical to those of the high-density arrays 110 described above, and thus a detailed description thereof will be omitted.

X-decoders 620 and Y-decoders 630 included in RAM 600 may be substantially identical to X-decoders 120 and Y-decoders 130 included in storage memory 100, and thus a detailed description thereof will not be repeated.

As described above, resistive memory 10 may include storage memory 100 and RAM 600 having different cell structures on a same semiconductor integrated circuit chip. Therefore, resistive memory 10 may be manufactured at a lower cost, may exhibit high performance, and may provide a relatively simple memory structure.

Sense amp & write driver 300 may write and/or read data to or from a selected resistive memory cell. That is, sense amp & write driver 300 may write the reset data to a resistive memory cell by supplying a reset voltage having a voltage level at which a filament may be disconnected. Sense amp & write driver 300 may write the set data by supplying a set voltage having a voltage level at which the filament may be reconnected. In addition, sense amp & write driver 300 may read stored data to determine whether the read data is the reset data or the set data by supplying a voltage having a voltage level at which the state of the filament remains unchanged. Here, the set voltage may be higher than the reset voltage.

High-density arrays 110 and high-speed arrays 610 may share sense amp & write driver 300. To this end, resistive memory chip 10 may include first selection switches (indicated by reference character "HDS" in FIGS. 6 and 10) coupled between sense amp & write driver 300 and high-density arrays 110 and second selection switches (indicated by reference character "HSS" in FIGS. 6 and 10) coupled between sense amp & write driver 300 and high-speed arrays 610. The first and second selection switches HDS and HSS will be described in detail later with reference to FIGS. 6 and 10.

When the high-density arrays 110 and the high-speed arrays 610 share sense amp & write driver 300, an area of the resistive memory chip 10 occupied by sense amp & write driver 300 may be reduced, thereby reducing a size of the resistive memory chip 10.

In the peripheral circuit region 800, a plurality of logic circuit blocks and a voltage generator may be implemented to operate the X-decoders 120 and 620, the Y-decoders 130 and 630, and the sense amp & write driver 300.

Different cell structures of the resistive memory chip 10 illustrated in FIG. 1 will now be described in more detail with reference to FIGS. 3A through 5C.

Figure 3A:
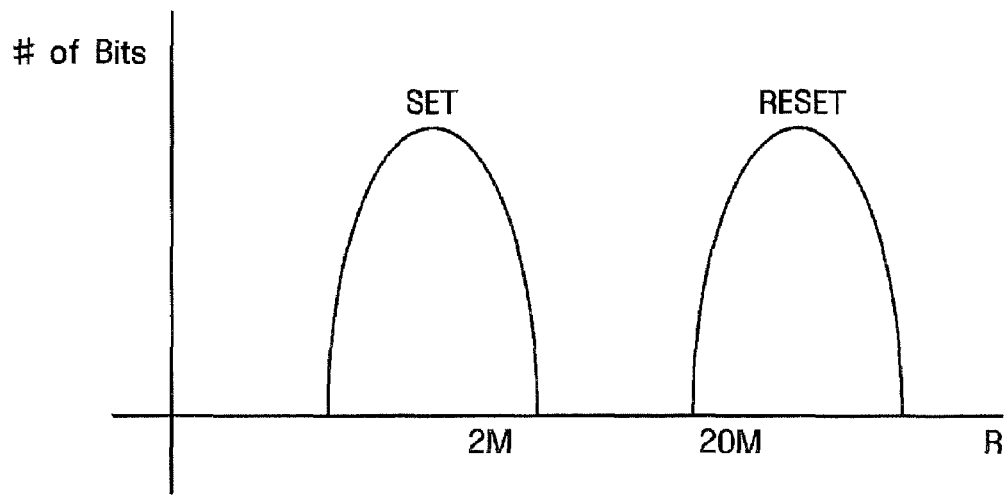
FIG. 3A is a diagram illustrating resistance distributions of variable resistive memory cells included in high-speed arrays of FIG. 1.
Figure 3B:
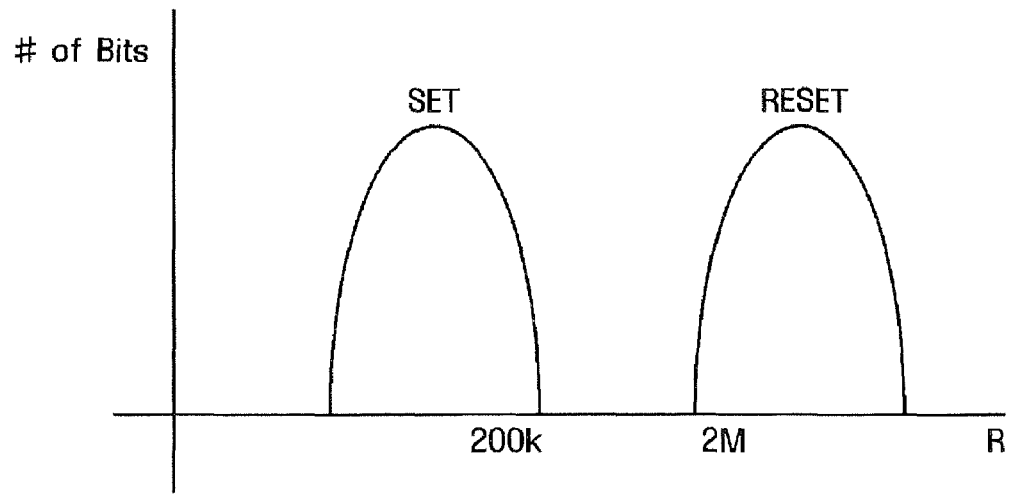
FIG. 3B is a diagram illustrating resistance distributions of variable resistive memory cells included in high-speed arrays of FIG. 1.

FIG. 3A is a diagram illustrating resistance distributions of variable resistive memory cells included in high-speed arrays 110 of FIG. 1. FIG. 3B is a diagram illustrating resistance distributions of variable resistive memory cells included in high-speed arrays 610 of FIG. 1. In FIGS. 3A and 3B, the x-axis represents resistance R of variable resistive memory cells, and the y-axis represents the number of variable resistive memory cells.

Referring to FIGS. 3A and 3B, each variable resistive memory cell may have a resistance level corresponding to the first data or a resistance level corresponding to the second data. More particularly, a case where each variable resistance memory cell stores 1-bit data is illustrated in FIGS. 3A and 3B. In this case, the first data is the set data, and the second data is the reset data.

Although not shown in the drawings, each variable resistive memory cell may store more than one bit. When each variable resistive memory cell stores more than one bit, each cell may have resistance levels corresponding to more data. For example, when each variable resistive memory cell is a 2-bit memory cell that can store 2 bits, each cell may have one of four different resistance levels corresponding to data stored therein.

Referring to FIG. 3A, the variable resistive memory cells included in high-density arrays 110 may have a first resistance level which corresponds to the first data (i.e., the set data) or a second resistance level which corresponds to the second data (i.e., the reset data) that is higher than the first resistance level. The first resistance level may be, for example, less than 2 MΩ (mega ohms) and the second resistance level may be greater than 20 MΩ (mega ohms).

Referring to FIG. 3B, the variable resistive memory cells included in high-speed arrays 610 may have a third resistance level which corresponds to the first data (i.e., the set data) or a fourth resistance level which corresponds to the second data (i.e., the reset data) that is higher than the third resistance level. The third resistance level may be, for example, less than 200 kΩ (kilo-ohms), and the fourth resistance level may be greater than 2 MΩ (mega-ohms).

Resistance levels of the variable resistive memory cells included in high-speed arrays 610 illustrated in FIG. 3B may be, on the whole, lower than resistance levels of the variable resistive memory cells included in high-density arrays 110 illustrated in FIG. 3A. Specifically, the third resistance level may be lower than the first resistance level, and the fourth resistance level may be lower than the second resistance level. Data may be read at a different speed according to the resistance level. That is, data may be read relatively more quickly from the variable resistive memory cells of high-speed arrays 610 which have, on the whole, lower resistance levels.

An example of different cell structures of resistive memory 10 illustrated in FIG. 1 will now be described with reference to FIGS. 4A through 4C.

In this example of different cell structures, sizes of variable resistive memory cells included in high-density arrays 110 may be different from sizes of variable resistive memory cells included in high-speed arrays 610.

Figure 4A:
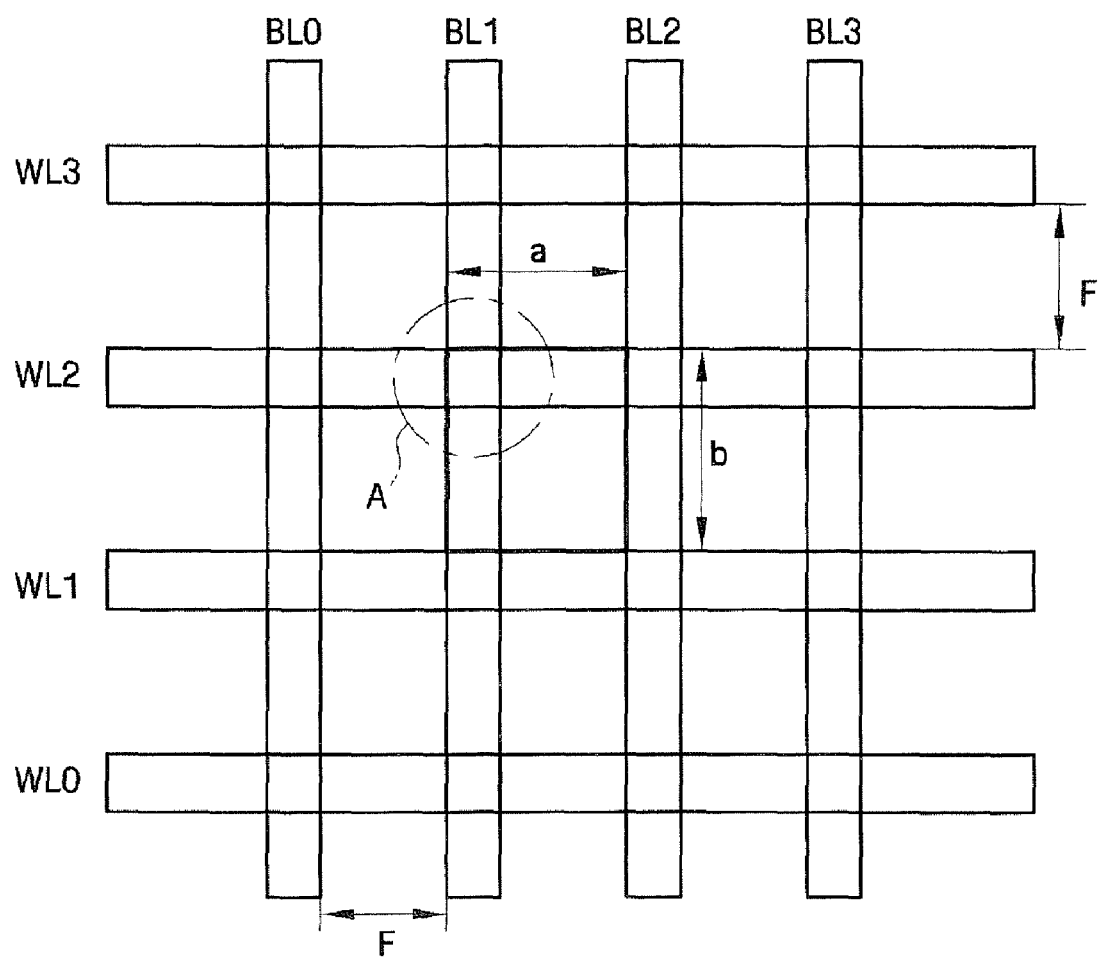
FIGS. 4A and 4B are diagrams illustrating cell size.
Figures 4B, 4C:
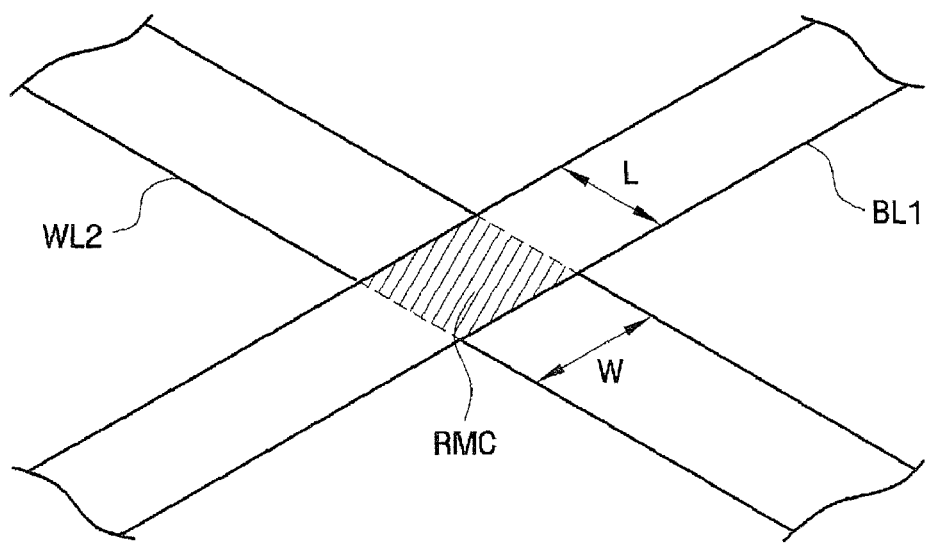
FIG. 4C illustrates specifications of variable resistive memory cells included in high-density arrays and specifications of variable resistive memory cells included in high-speed arrays.

FIGS. 4A and 4B are diagrams illustrating a cell size. Specifically, FIG. 4A is a top view of a plurality of wordlines WL0 through WL3 and a plurality of bitlines BL0 through BL3 which cross wordlines WL0 through WL3. FIG. 4B is a perspective view of a region "A" shown in FIG. 4A.

In FIG. 4A, reference character "F" indicates a size of a predetermined lithographic pattern. In FIG. 4B, reference character "W" indicates a width of a wordline, and "L" indicates a width of a bitline.

Referring to FIGS. 4A and 4B, each resistive memory cell RMC may be defined in a region where a wordline and a bitline cross each other. A size of each resistive memory cell RMC may be "a" multiplied by "b" as illustrated in FIG. 4A. For example, when a gap between every two of the wordlines WL0 through WL3 is "F" and when a gap between every two of the bitlines BL0 through BL3 is "F," if a width W of each of the wordlines WL0 through WL3 and a width L of each of the bitlines BL0 through BL3 are "F," a cell size of each resistive memory cell RMC may be 4F2. In this case, when width W of each of wordlines WL0 through WL3 and the width L of each of the bitlines BL0 through BL3 are increased, the cell size of each resistive memory cell RMC also increases. Generally, when cell size is increased, resistance levels corresponding to the first data and resistance levels corresponding to the second data may be reduced overall.

FIG. 4C illustrates specifications of variable resistive memory cells included in high-density arrays 110 and specifications of variable resistive memory cells included in high-speed arrays 610. In FIG. 4C, a value corresponding to "On" in resistance (cell R) of each variable resistive memory cell is a lowest value of the first resistance level, and a value corresponding to "Off" is a highest value of the first resistance level.

A cell size of each variable resistive memory cell included in the high-density arrays 110 may be, e.g., 4F2, and a saturation current of a diode may be 10 μA (micro amp). In the case of the resistance (cell R) of each variable resistive memory cell, the highest value of the first resistance level may be 2 MΩ (mega-ohms) in the "on" or "set" state, and the lowest value of the second resistance level may be 20 MΩ (mega-ohms) in the "Off" or the "Reset" State.

On the other hand, cell size of each variable resistive memory cell included in high-speed arrays 610 may be, e.g., 8F2. In this case, a saturation current of a diode may be 100 μA (micro amp). In the case of the resistance (cell R) of each variable resistive memory cell, a highest value of the third resistance level may be 200 kΩ (kilo ohms) in the "On" or "Set" state, and a lowest value of the fourth resistance level may be 2 MΩ (mega ohms) in the "Off" or "Reset" state.

As illustrated in FIG. 4C, when the cell size is increased, resistance levels corresponding to the first data and resistance levels corresponding to the second data may be reduced overall. Since data can be read at a relatively high speed from resistive memory cells having a relatively large cell size, an array including resistive memory cells having a relatively large cell size can be used to provide a high-speed array.

Another example of different cell structures of resistive memory 10 illustrated in FIG. 1 will now be described with reference to FIGS. 5A through 5C.

In this example of different cell structures, cell heights of variable resistive memory cells included in high-density arrays 110 may be different from cell heights of variable resistive memory cells included in high-speed arrays 610.

Figure 5A:
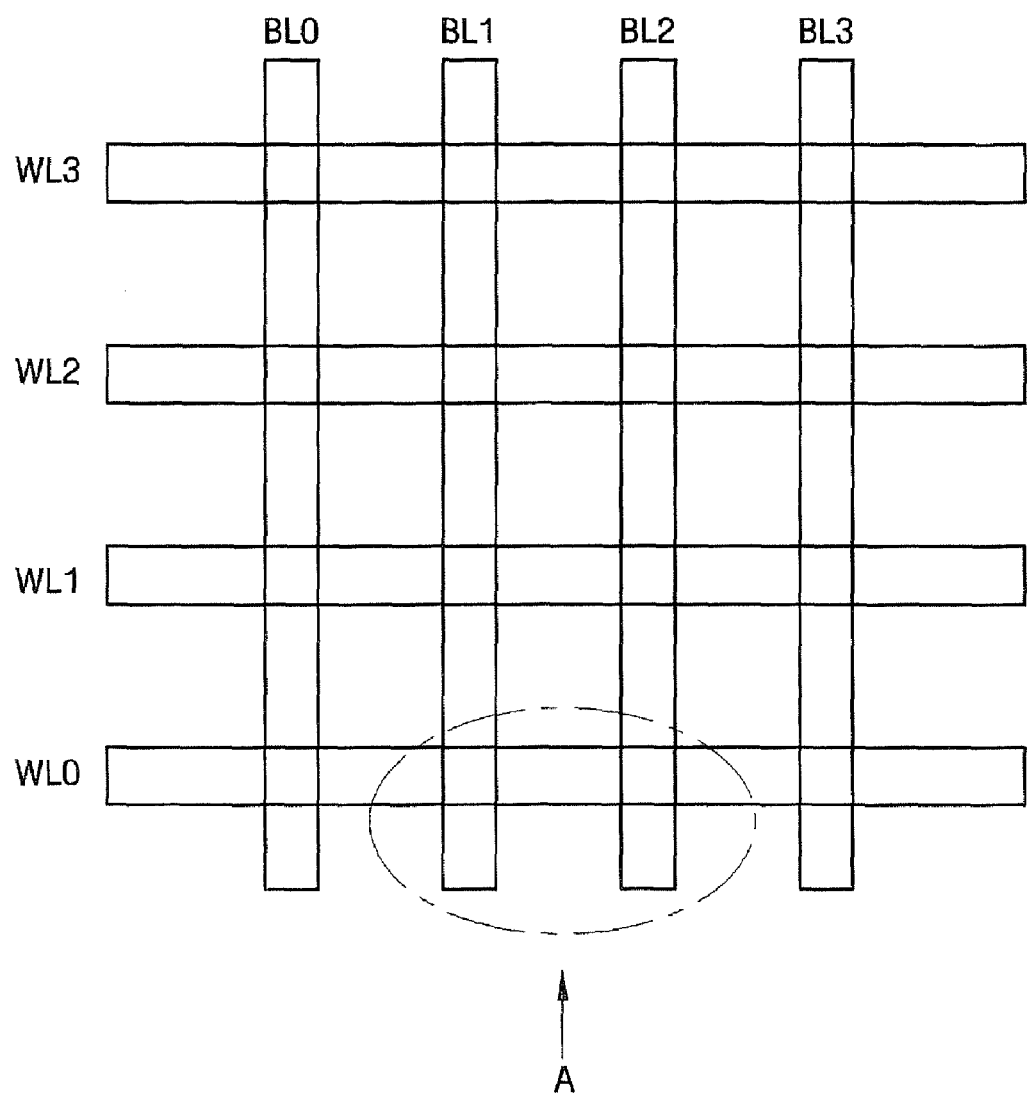
FIGS. 5A and 5B are diagrams illustrating cell height.
Figures 5B, 5C:
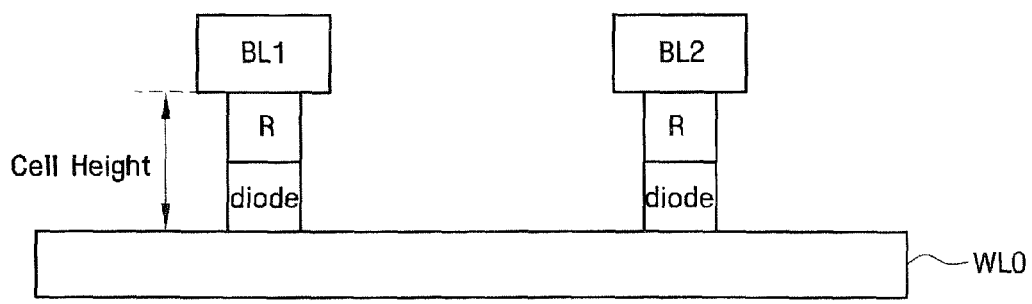
FIG. 5C illustrates specifications of variable resistive memory cells included in high-density arrays and specifications of variable resistive memory cells included in high-speed arrays.

FIGS. 5A and 5B are diagrams illustrating cell height. More particularly, FIG. 5A is a top view of a plurality of wordlines WL0 through WL3 and a plurality of bitlines BL0 through BL3 which cross wordlines WL0 through WL3. FIG. 5B is a cross sectional view of a region indicated by dotted lines in FIG. 5A, as seen in a direction indicated by an arrow "A."

Referring to FIGS. 5A and 5B, each resistive memory cell may be defined in a region where a wordline and a bitline cross each other. As described above, a resistive memory cell may include a variable resistance device and an access device. In FIG. 5B, a variable resistance device and the access device are represented respectively by resistor R and a diode, and "Cell Height" indicates a height of each resistive memory cell. When cell height is increased, a height of resistor R increases. As a result, resistance levels corresponding to the first data and resistance levels corresponding to the second data may be reduced overall.

FIG. 5C illustrates specifications of variable resistive memory cells included in high-density arrays 110 and specifications of variable resistive memory cells included in high-speed arrays 610. In FIG. 5C, a value corresponding to "On" in resistance (cell R) of each variable resistive memory cell is a lowest value of the first resistance level, and a value corresponding to "Off" is a highest value of the first resistance level.

A cell height of each variable resistive memory cell included in the high-density array 110 may be, e.g., 5 nm (nanometer), and, a saturation current of a diode may be 10 μA (micro-amp). In the case of the resistance (cell R) of each variable resistive memory cell, a highest value of the first resistance level may be 2 MΩ (mega-ohms) in the "On" or "Set" state, and a lowest value of the second resistance level may be 20 MΩ (mega-ohms) in the "Off" or "Reset" state.

On the other hand, a cell height of each variable resistive memory cell included in high-speed arrays 610 may be, e.g., 10 nm (nanometers), and a saturation current of a diode may be 100 μA (micro-amp). In the case of the resistance (cell R) of each variable resistive memory cell, a highest value of the third resistance level may be 200 kΩ (kilo ohms) in the "On" or "Set" state, and a lowest value of the fourth resistance level may be 2 MΩ (mega-ohms) in the "Off" or "Reset" state.

As illustrated in FIG. 5C, when the cell height is increased, resistance levels corresponding to the first data and resistance levels corresponding to the second data may be reduced overall. Since data can be read at a relatively high speed from resistive memory cells having a relatively large cell height, an array including resistive memory cells having a relatively large cell height can be used as a high-speed array.

Figure 6:
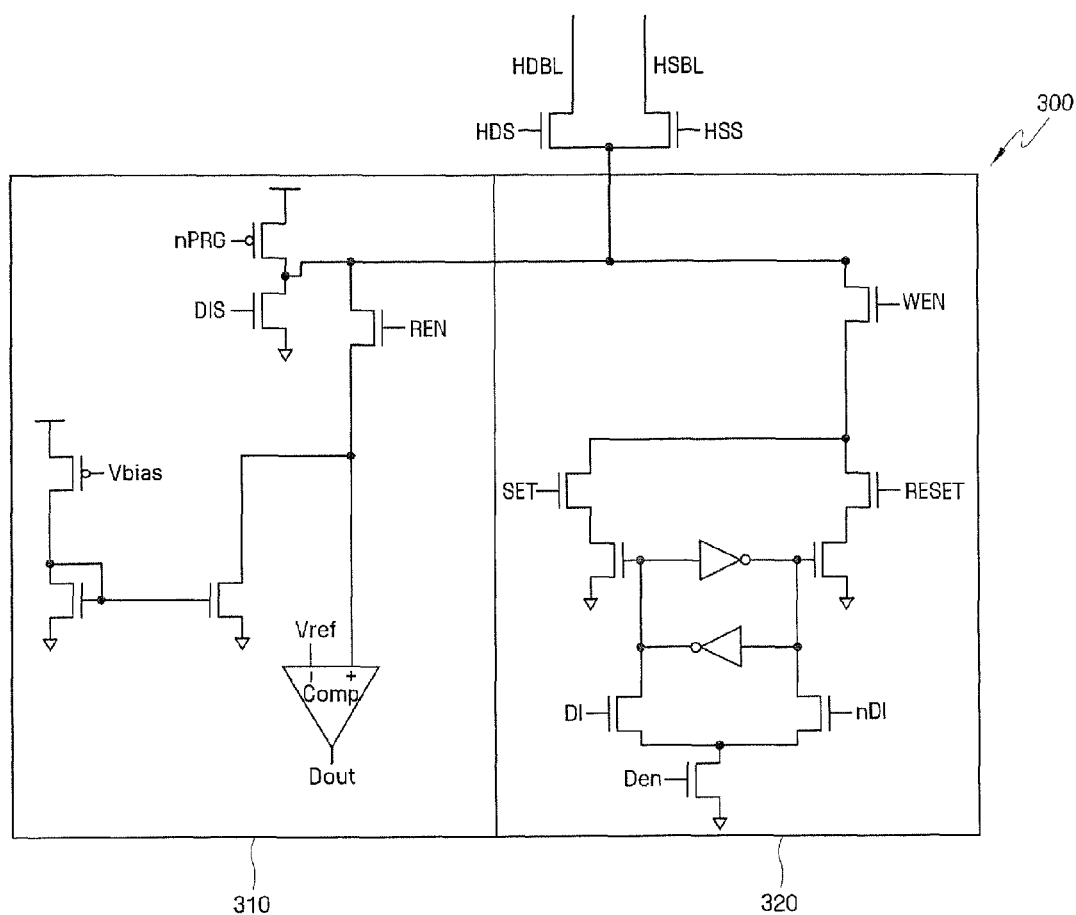
FIG. 6 is a circuit diagram of a sense amp & write driver included in the resistive memory of FIG. 1.

FIG. 6 is a circuit diagram of sense amp & write driver 300 included in resistive memory 10 of FIG. 1.

Referring to FIG. 6, each cell of sense amp & write driver 300 may be divided into a read sense amplifier 310 and a write driver 320. When two inverters illustrated in FIG. 6 each include one n-channel metal-oxide semiconductor (nMOS) and one p-channel metal-oxide semiconductor (pMOS), 20 metal-oxide-semiconductor field-effect transistors (MOSFETs) may be used to implement each cell of sense amp & write driver 300.

Referring to FIG. 6, resistive memory 10 may include first selection switches HDS coupled between sense amp & write driver 300 and the high-density arrays 110 and second selection switches HSS coupled between sense amp & write driver 300 and high-speed arrays 610. In FIG. 6, bitlines HDBL of high-density arrays 110 and bitlines HSBL of high-speed arrays 610 are illustrated.

To read or write data from/to resistive memory cells included in high-density arrays 110, first selection switches HDS are turned on while the second selection switches HSS are turned off. To read or write data from/to resistive memory cells included in high-speed arrays 610, second selection switches HSS are turned on while first selection switches HDS are turned off.

First and second selection switches HDS and HSS included in the resistive memory chip 10 may enable high-density arrays 110 and high-speed arrays 610 to share sense amp & write driver 300.

A write method and a read method used by sense amp & write driver 300 illustrated in FIG. 6 will now be described. The write method used by sense amp & write driver 300 may be substantially identical to a write method used by sense amp & write driver 301 which will be described later with reference to FIG. 10, and thus a detailed description thereof will be omitted.

Figure 7:
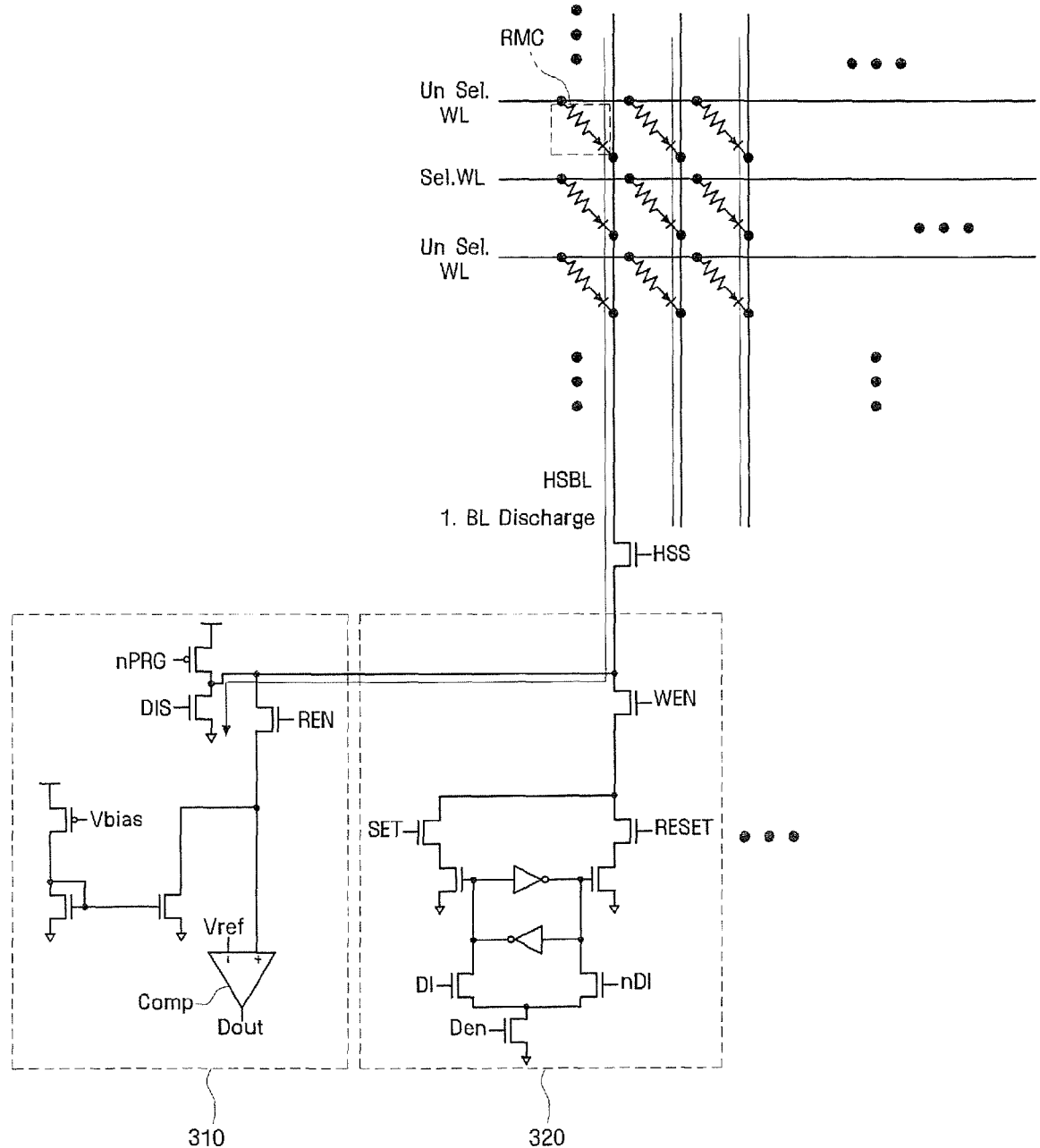
FIGS. 7 through 9 are circuit diagrams illustrating a read method used by a read sense amplifier of FIG. 6.
Figure 8:
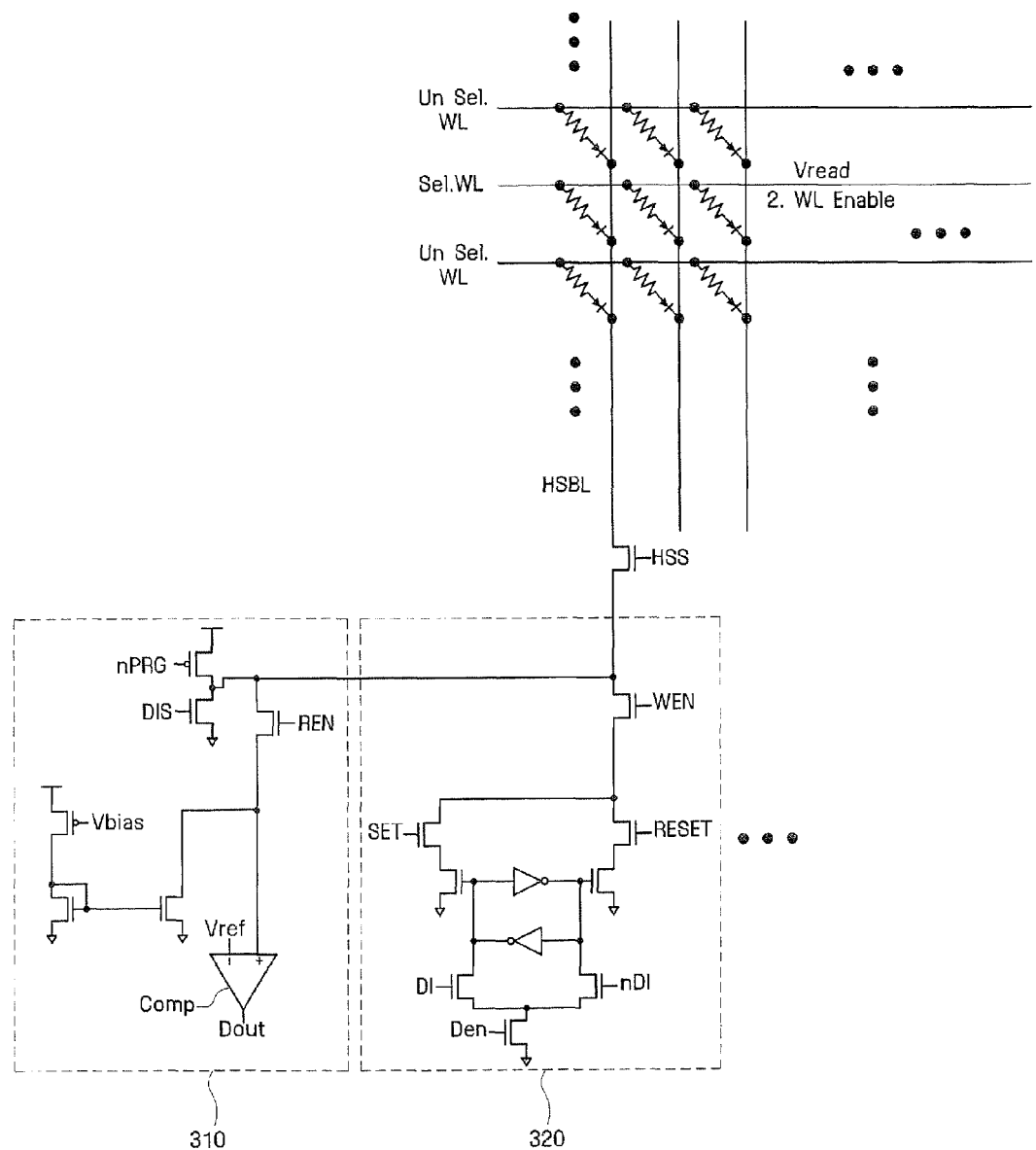
Figure 9:
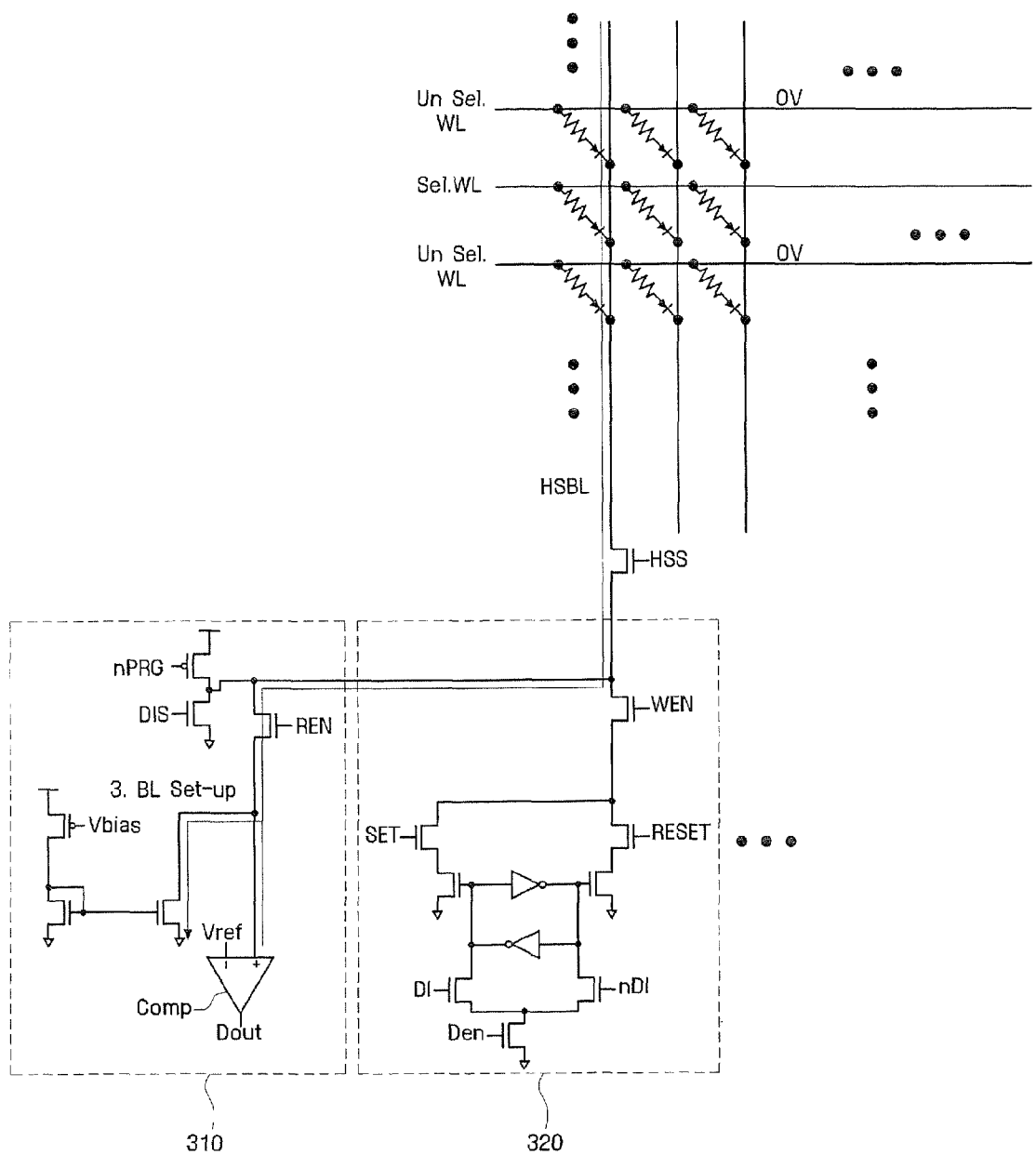

Read sense amplifier 310 illustrated in FIG. 6 may read data using current sensing. A read method used by read sense amplifier 310 illustrated in FIG. 6 will now be described in detail with reference to FIGS. 7 through 9. FIGS. 7 through 9 are circuit diagrams illustrating a read method used by read sense amplifier 310 of FIG. 6. FIGS. 7 through 9 illustrate a case where data is read from high-speed arrays 610, that is, a case where second selection switches HSS are turned on. For ease of illustration, first selection switches HDS are not illustrated in FIGS. 7 through 9.

Referring to FIG. 7, an address of each variable resistive memory cell from which data is to be read is set up, and corresponding bitline HSBL of high-speed arrays 610 is discharged through a transistor DIS.

Referring to FIG. 8, a selected wordline Sel. WL is enabled. Here, a voltage of the selected wordline Sel. WL may be Vread.

Referring to FIG. 9, the bitline HSBL of the high-speed arrays 610 is set up, and data is output through comparator Comp.

More particularly, a constant current may flow through a transistor Vbias having a gate to which a predetermined bias voltage is applied and a transistor which is connected in series to the transistor Vbias and whose gate and drain are connected to each other. In addition, a variable current may flow through a transistor REN having a gate to which a read enable signal is transmitted and a transistor connected in series to the transistor REN. A magnitude of the variable current varies according to the resistance level of a resistive memory cell to be read. Accordingly, a magnitude of a voltage applied to a plus terminal of comparator Comp is changed. Comparator Comp compares a voltage applied to its plus terminal with a reference voltage Vref applied to its minus terminal and outputs a logic high or low value through its output terminal Dout. The read operation may then be terminated.

Data can be read faster through current sensing described above than voltage sensing because current sensing may not require the development time that may be required in voltage sensing. Development time will be described in detail later with reference to FIG. 15. When current sensing is performed as described above, data reading speeds may be increased.

Figure 10:
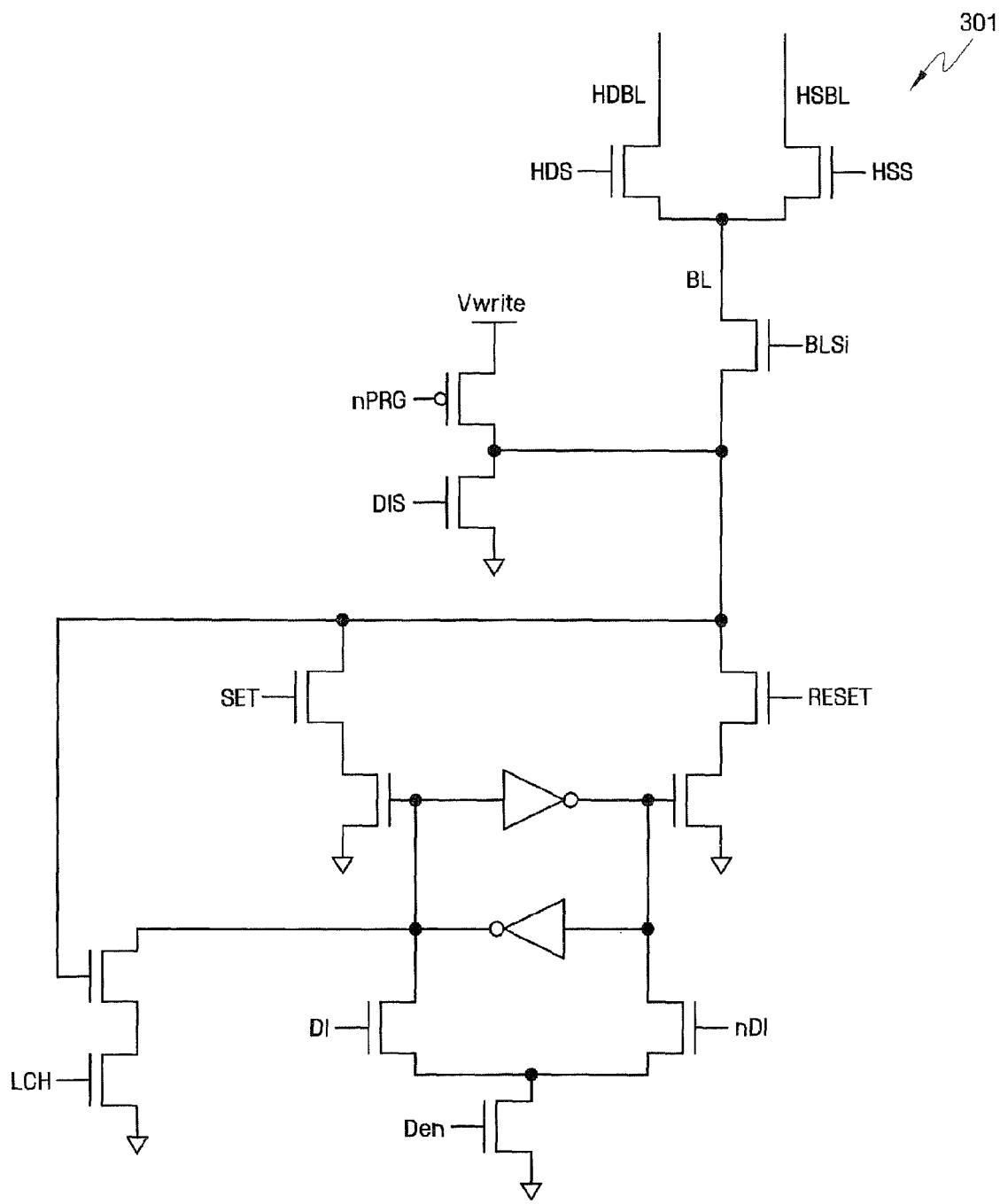
FIG. 10 is a circuit diagram of another sense amp & write driver included in the resistive memory chip of FIG. 1.

FIG. 10 is a circuit diagram of another sense amp & write driver 301 that may be included in the resistive memory 10 of FIG. 1.

Referring to FIG. 10, a read sense amplifier and a write driver may be integrated with each other in each cell of sense amp & write driver 301. When two inverters illustrated in FIG. 10 each include one nMOS transistor and one pMOS transistor, 16 MOSFETs may be used to implement each cell of sense amp & write driver 301.

While each cell of sense amp & write driver 300 of FIG. 6 described above may include 20 MOSFETs, each cell of sense amp & write driver 301 of FIG. 10 may include a smaller number of MOSFETs.

Referring to FIG. 10, resistive memory 10 may include first selection switches HDS coupled between sense amp & write driver 301 and high-density arrays 110 and second selection switches HSS coupled between sense amp & write driver 301 and high-speed arrays 610. In FIG. 10, bitlines HDBL of high-density arrays 110 and bitlines HSBL of high-speed arrays 610 are illustrated.

To read or write data from/to resistive memory cells included in high-density arrays 110, first selection switches HDS are turned on while second selection switches HSS are turned off. To read or write data from/to resistive memory cells included in high-speed arrays 610, second selection switches HSS are turned on while first selection switches HDS are turned off.

First and second selection switches HDS and HSS included in resistive memory 10 enable high-density arrays 110 and high-speed arrays 610 to share sense amp & write driver 301.

Figure 11:
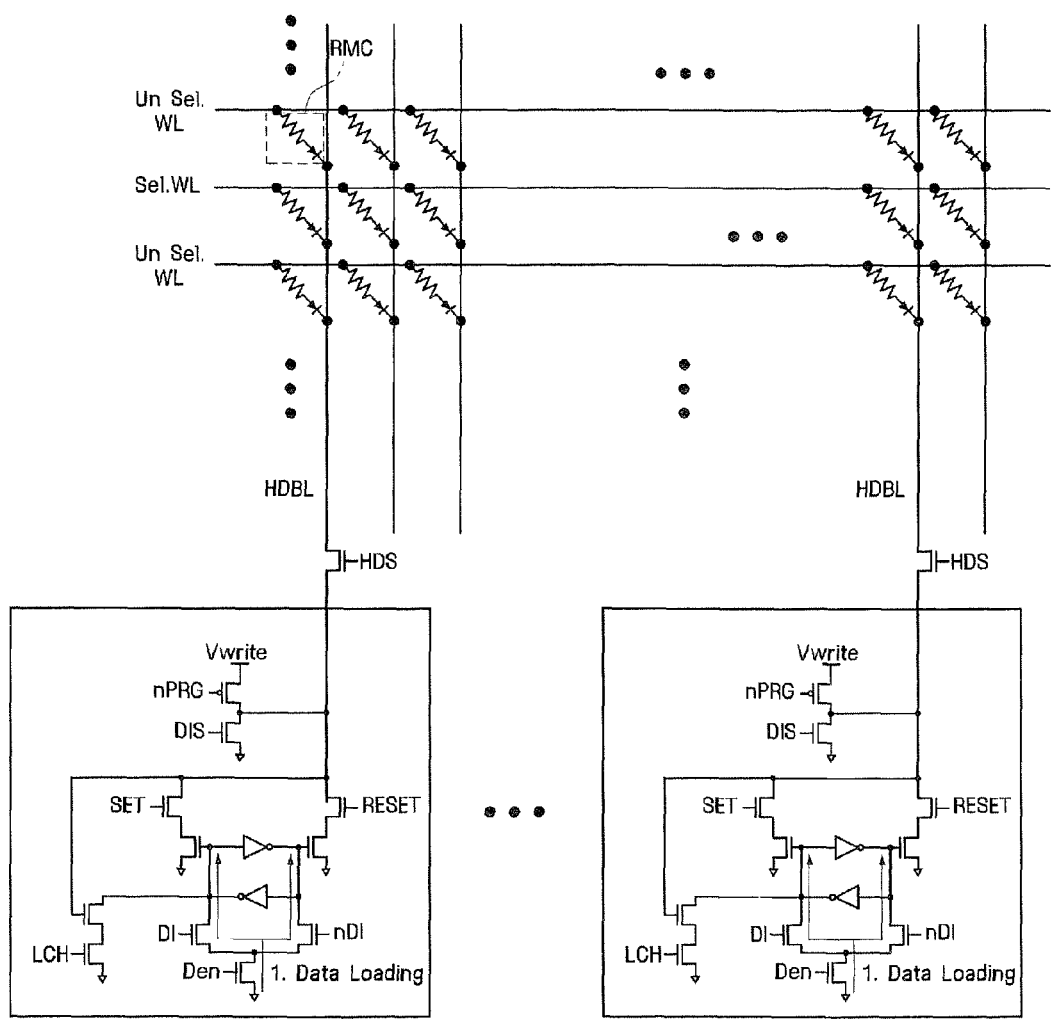
FIGS. 11 through 13 are circuit diagrams illustrating a write method used by the sense amp & write driver of FIG. 10.
Figure 12:
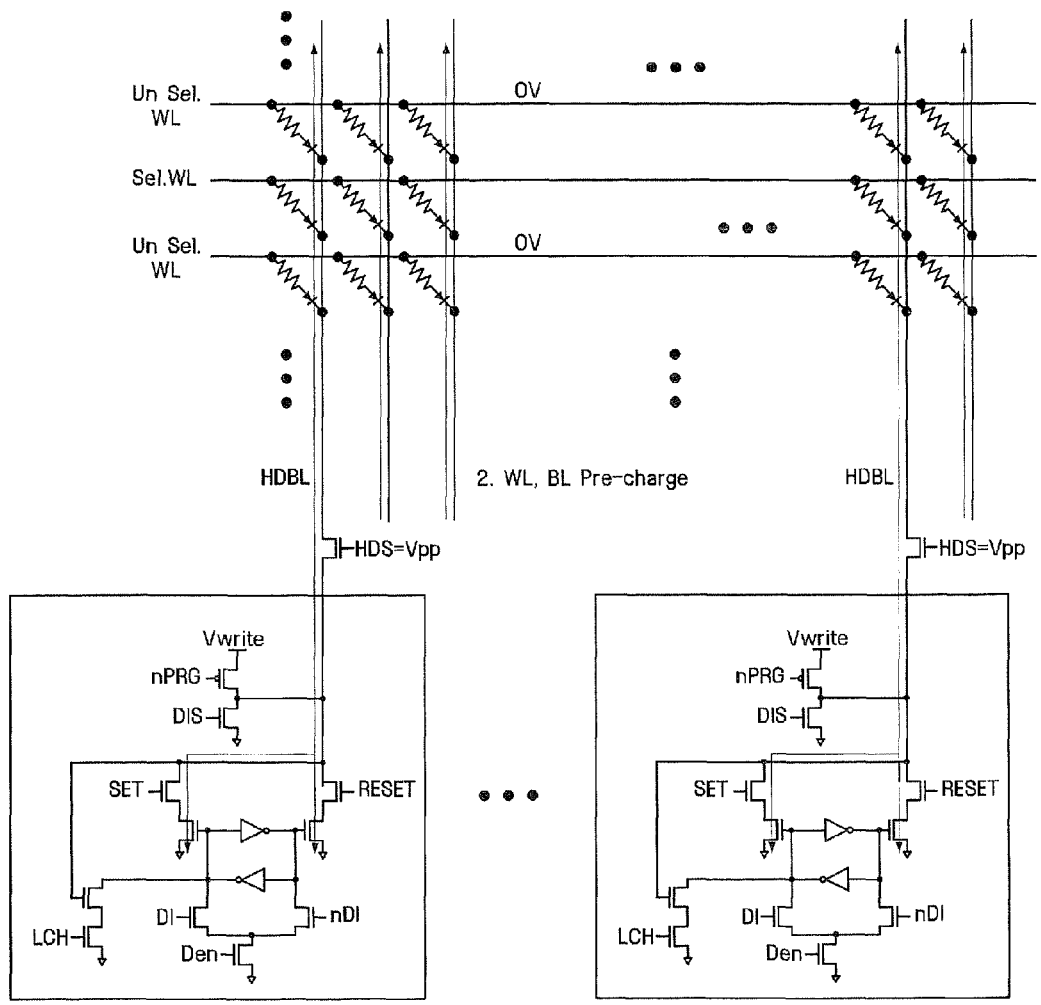
Figure 13:
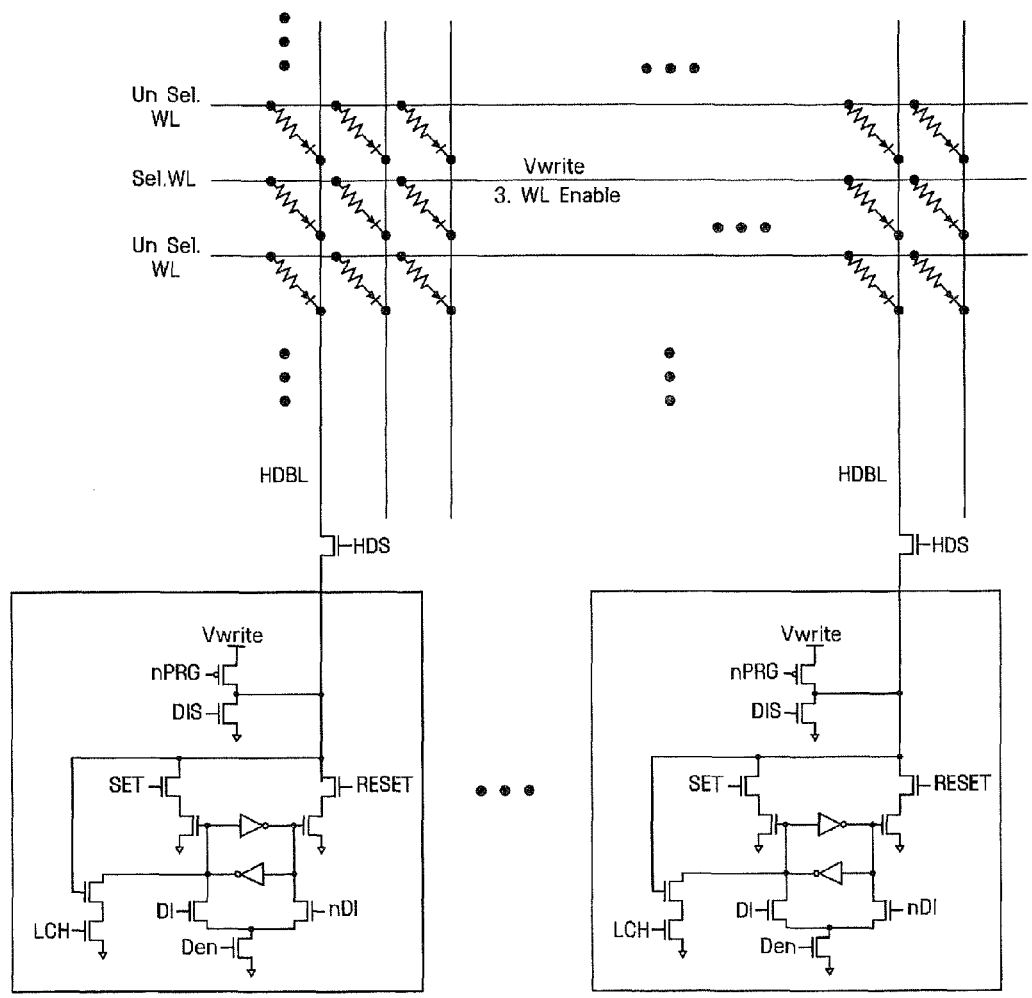

A write method used by sense amp & write driver 301 illustrated in FIG. 10 will now be described with reference to FIGS. 11 through 13. FIGS. 11 through 13 are circuit diagrams illustrating a write method used by sense amp & write driver 301 of FIG. 10. FIGS. 11 through 13 illustrate a case where data is written to high-density arrays 110, that is, a case where first selection switches HDS are turned on. For ease of illustration, second selection switches HSS are not illustrated in FIGS. 11 through 13.

Referring to FIG. 11, an address of each variable resistive memory cell to which data is to be written is set up, transistor Den is turned on, and data is stored in a latch through a transistor DI and/or nDI (data loading).

In FIG. 11, a plurality of bitlines HDBL of the high-density arrays 110, unselected wordlines UnSel. WL, a selected wordline Sel. WL, and a plurality of resistive memory cells RMC are illustrated. A variable resistance device and an access device included in each resistive memory cell RMC are represented respectively by a resistor and a diode which is connected in series with the resistor.

Referring to FIG. 12, the selected wordline Sel. WL and a corresponding bitline HDBL of the high-density arrays 110 are pre-charged. A voltage Vpp may be applied to a gate of a transistor HDS, and the voltage of each wordline WL may become a ground voltage (e.g., 0 V) through a charge path illustrated in FIG. 12.

Referring to FIG. 13, a voltage applied to a gate of a transistor SET or RESET and a current flowing through a drain or source of the transistor SET or RESET are controlled to write data 0 or 1 (WL enable). Here, the voltage of the selected wordline Sel. WL may be Vwrite. After a recovery period, the write operation is terminated.

Figure 14:
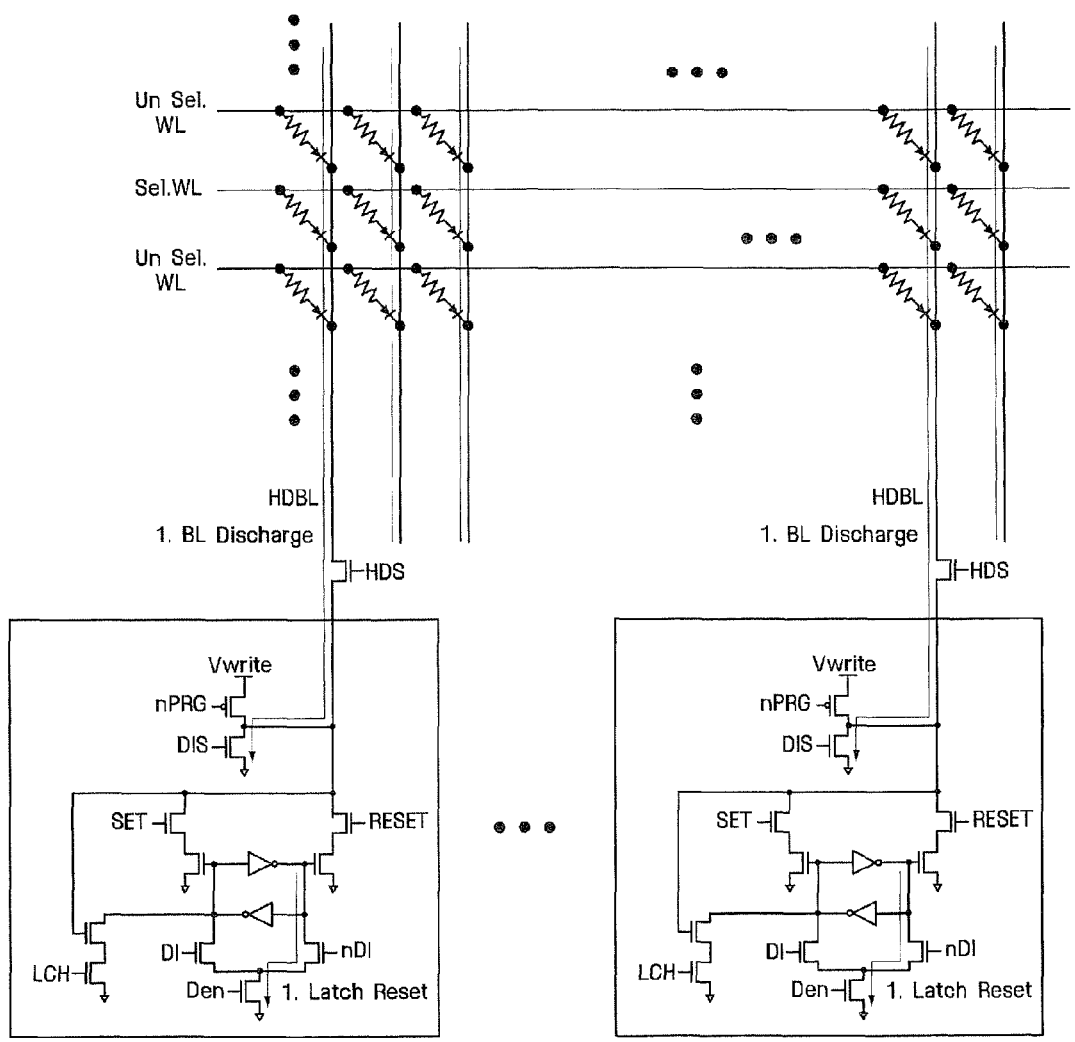
FIGS. 14 through 16 are circuit diagrams illustrating a read method used by the sense amp & write driver of FIG. 10.
Figure 15:
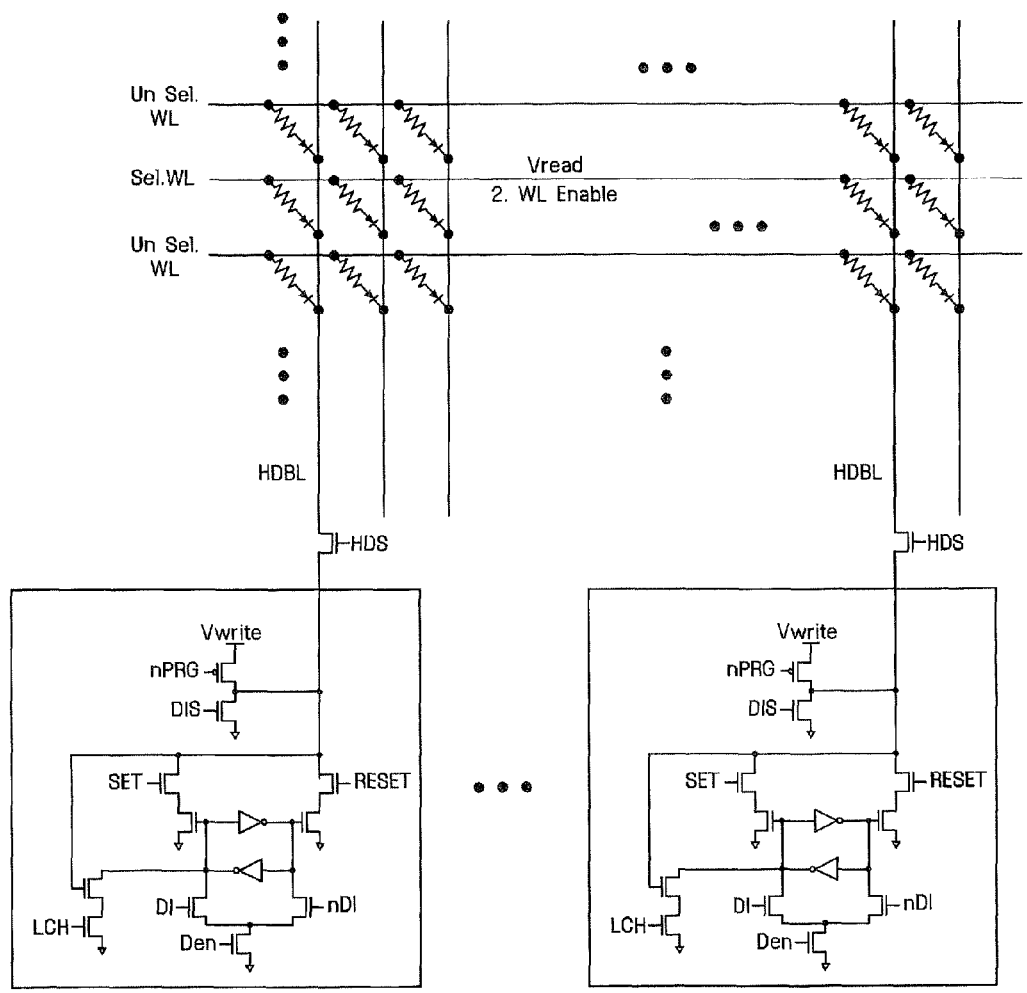
Figure 16:
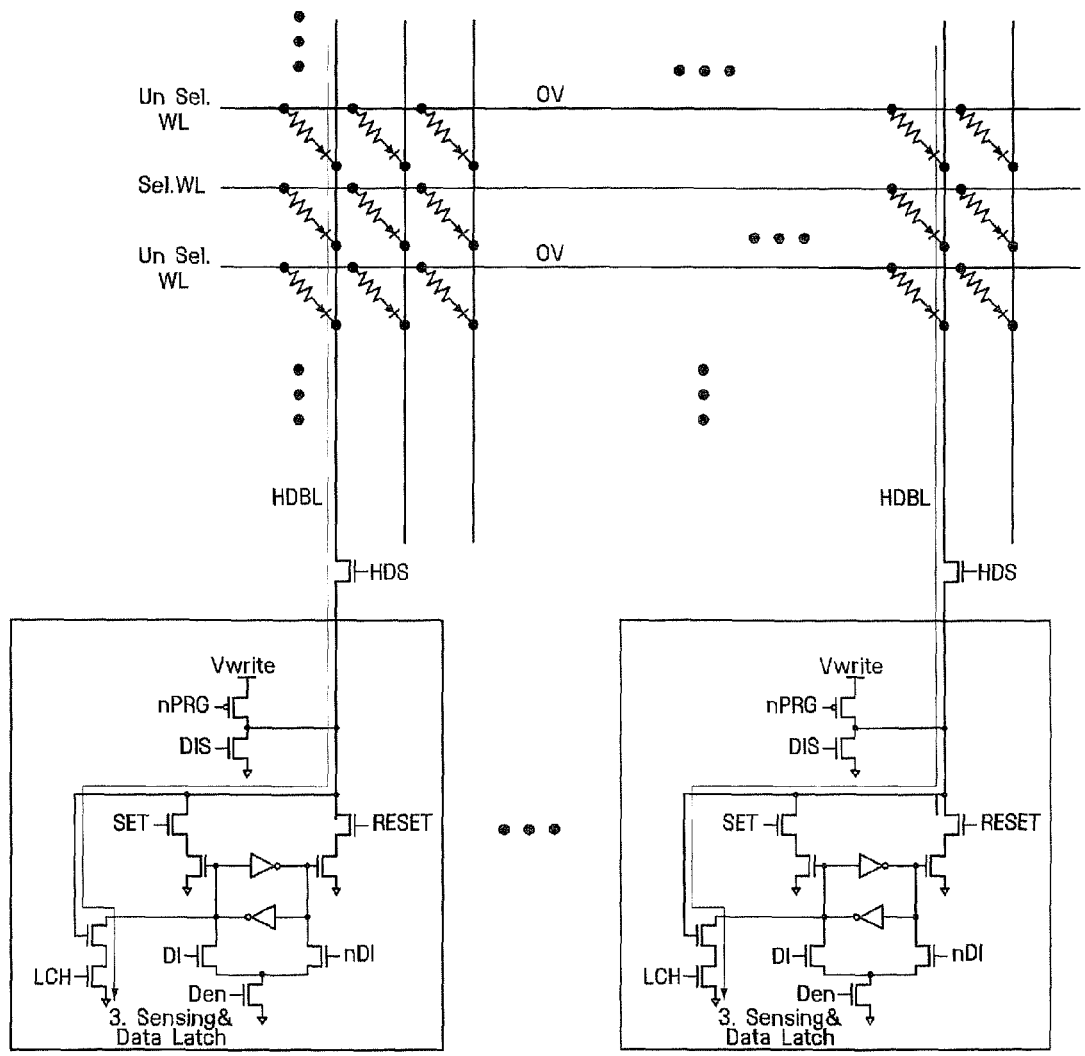

Sense amp & write driver 301 illustrated in FIG. 10 may read data by performing voltage sensing using a coupling ratio. A read method used by sense amp & write driver 301 illustrated in FIG. 10 will now be described in detail with reference to FIGS. 14 through 16. FIGS. 14 through 16 are circuit diagrams illustrating a read method used by sense amp & write driver 301 of FIG. 10.

Referring to FIG. 14, transistor Den is turned on, and the latch is reset using the transistor nDI. In addition, a corresponding bitline HDBL of high-density arrays 110 is discharged through transistor DIS.

Referring to FIG. 15, selected wordline Sel. WL is enabled, and bitline HDBL of high-density arrays 110 which is connected to a resistive memory cell from which data is to be read is developed. Here, a voltage of the selected wordline Sel. WL may be Vread.

Referring to FIG. 16, a voltage level is sensed, and data is latched. More particularly, a transistor HDS, a transistor LCH, and a transistor connected in series with transistor LCH are turned on. As a result, a closed loop may be formed as indicated by an arrow in FIG. 10. Accordingly, a voltage level of the bitline HDBL connected to the resistive memory cell from which data is to be read is sensed, and data is latched. The read operation is then terminated.

Figure 17:
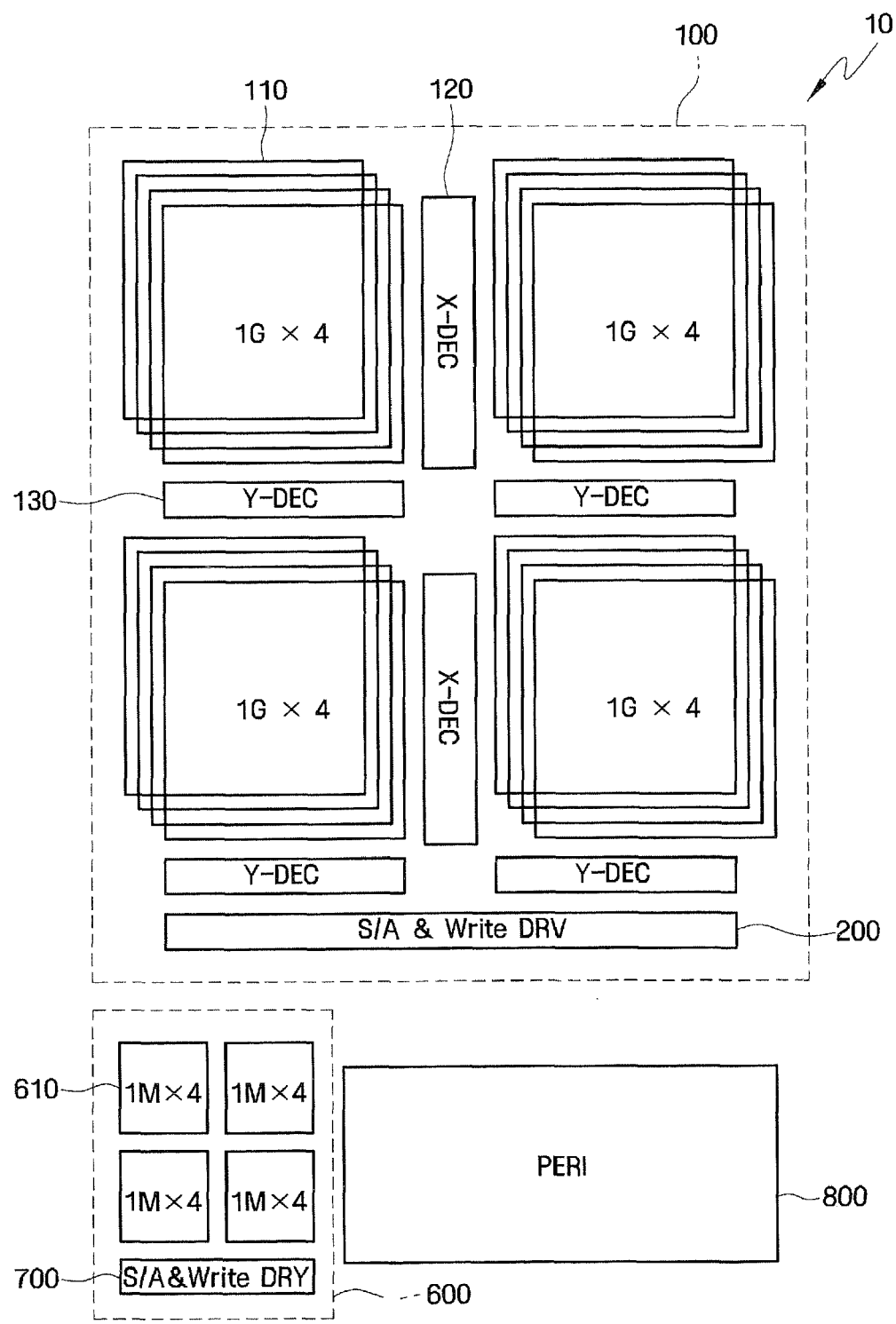
FIG. 17 is a block diagram of a resistive memory according to other embodiments of the present invention.

FIG. 17 is a block diagram of a resistive memory 10 according to other embodiments of the present invention.

Referring to FIG. 17, resistive memory 10 (for example, provided on an integrated circuit chip) may include storage memory 100 having a relatively large array size, RAM 600 having a relatively small array size, and a peripheral circuit region 800.

Storage memory 100 may include relatively high-density arrays 110, X-decoders 120, Y-decoders 130, and sense amp & write driver 200.

Sense amp & write driver 200 writes or reads data to or from a selected resistive memory cell. That is, sense amp & write driver 200 writes reset data to a resistive memory cell by supplying a reset voltage having a voltage level at which a filament may be disconnected. Sense amp & write driver 200 writes set data by supplying a set voltage having a voltage level at which the filament may be reconnected. In addition, sense amp & write driver 200 reads stored data to determine whether the read data is the reset data or the set data by supplying a voltage having a voltage level at which the state of the filament remains unchanged. Here, the set voltage may be higher than the reset voltage.

RAM 600 may include relatively high-speed arrays 610, X-decoders 620 (see FIG. 18), Y-decoders 630 (see FIG. 18), and sense amp & write driver 700. X-decoders 620, Y-decoders 630, and sense amp & write driver 700 included in the RAM 600 may be substantially identical to X-decoders 120, Y-decoders 130, and sense amp & write driver 200 of storage memory 100, and thus a detailed description thereof will be omitted.

Resistive memories (i.e., storage memory 100 and RAM 600) included in the resistive memory 10 of FIG. 17 can control access speed by adjusting their array sizes relatively freely, unlike other memories (e.g., DRAMs, NAND-type flash memories, NOR-type flash memories, and phase-change memories).

Of the above memories, DRAMs will now be described. A refresh operation is essential for DRAMs. The refresh operation is performed as follows. Each memory cell of a DRAM includes one switching transistor and one capacitor to memorize information. The DRAM may also include a sense amplifier including pairs of a bitline and a bit-bar line. When a refresh command is input to the DRAM, the voltage of a selected wordline is raised, thereby turning the switching transistor on. Accordingly, data stored in the capacitor to memorize information may be moved to the bitline or the bit-bar line. At this time, potential difference between the bitline and the bit-bar line may be relatively small. However, the sense amplifier may sense the small potential difference and may amplify the sensed potential difference to information "1" or "0." After amplification, a voltage of the selected wordline may be reduced, and the switching transistor may be turned off. Then, the amplified data (the information "1" or "0") is preserved in a corresponding memory cell.

When an array size of a DRAM is increased, lengths of bitlines may increase, thereby increasing a capacitance of the bitline. However, when a capacitance of the bitline is increased too much, noise resulting from a potential difference sensed by the sense amplifier may increase. For this reason, adjustment of an array size of a DRAM may be limited.

Unlike DRAMs and other memories, an array size of a resistive memory can be increased to implement storage memory 100 which operates at relatively low speed but can store a relatively large amount of data and can be reduced to implement the RAM 600 which operates at high speed. Since resistive memory 10 includes both of storage memory 100 and RAM 600 implemented by adjusting array sizes of resistive memories, resistive memory 10 may be manufactured at a lower cost, may exhibit higher performance, and/or may provide a simplified memory structure.

In peripheral circuit region 800, a plurality of logic circuit blocks and a voltage generator may be implemented to operate X-decoders 120 and 620 (see FIG. 18), Y-decoders 130 and 630 (see FIG. 18), and sense amp & write drivers 200 and 700.

Figure 18:
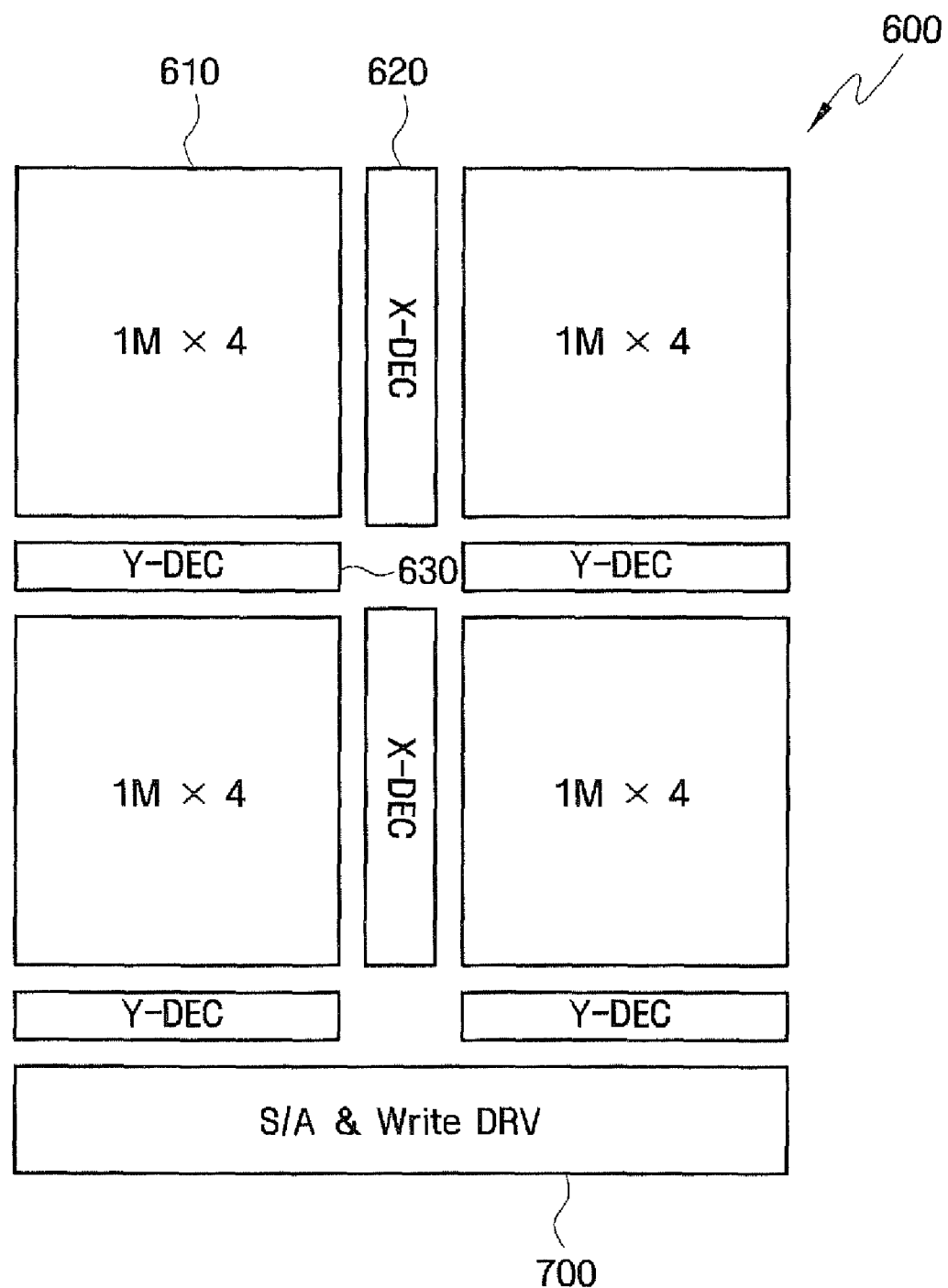
FIGS. 18 and 19 are block diagrams of a high speed array illustrated in FIG. 17.

FIG. 18 is a block diagram of RAM 600 included in resistive memory 10 of FIG. 17, according to some embodiments of the present invention. X-decoders 620 and Y-decoders 630 not shown in FIG. 17 are illustrated in FIG. 18.

Referring to FIG. 18, RAM 600 may include four high-speed arrays 610 arranged in a 2×2 matrix, and sense amp & write driver 700 may be disposed under a second row of the matrix.

In RAM 600 structured as illustrated in FIG. 18, a global bitline (not shown) may be implemented to reduce a number of required cells of sense amp & write driver 700. Accordingly, an area of resistive memory 10 occupied by sense amp & write driver 700 can be reduced, thereby reducing a size of resistive memory 10.

Figure 19:
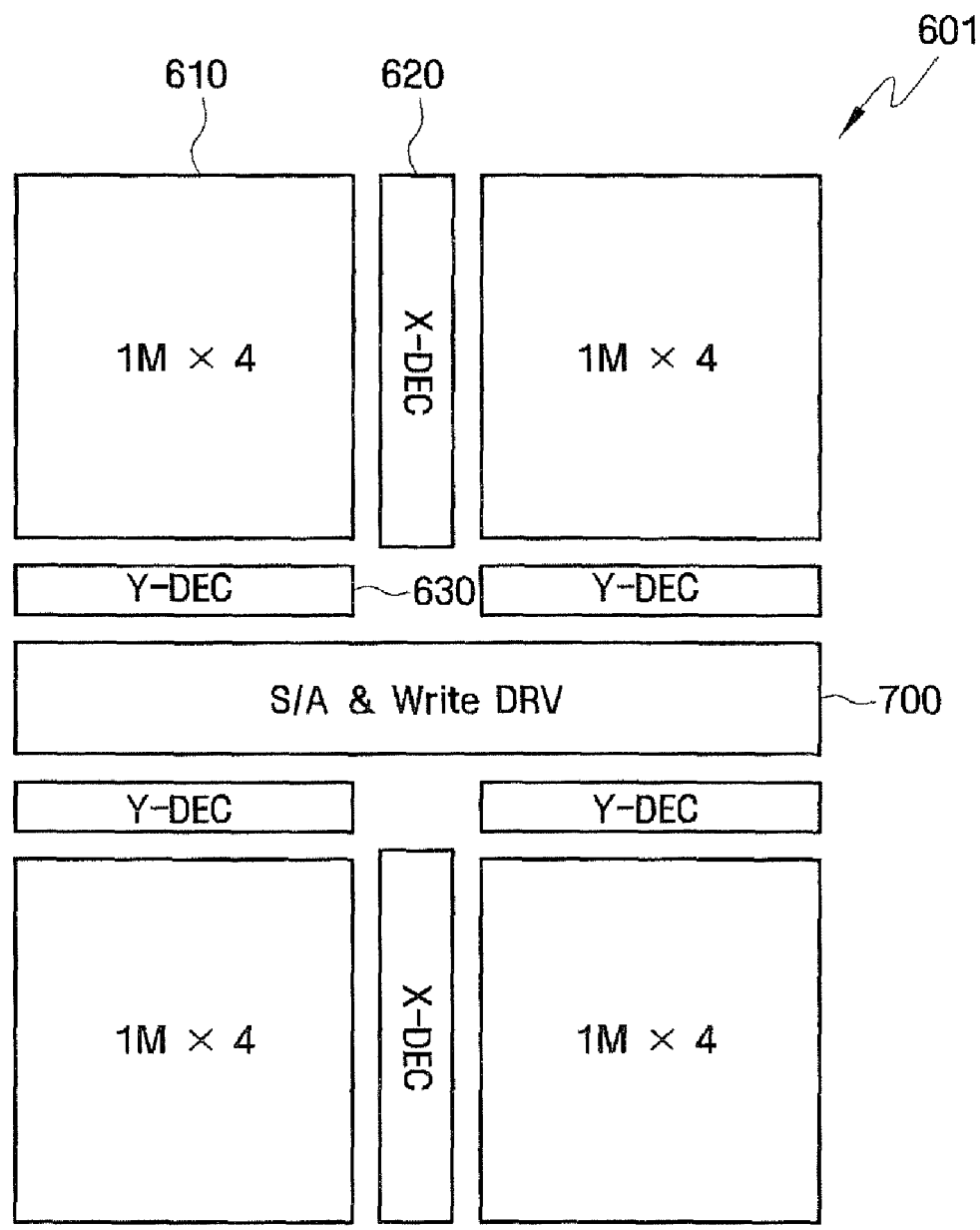

FIG. 19 is a block diagram of RAM 601 included in the resistive memory 10 of FIG. 17, according to other embodiments of the present invention. X-decoders 620 and Y-decoders 630 not shown in FIG. 17 are illustrated in FIG. 19.

Referring to FIG. 19, RAM 601 includes four high-speed arrays 610 arranged in a 2×2 matrix, and sense amp & write driver 700 interposed between first and second rows of the matrix.

In RAM 601 structured as illustrated in FIG. 19, sense amp & writer driver 700 is disposed closer to each high-speed array 610 than in RAM 600 structured as illustrated in FIG. 18. Therefore, a distance between sense amp & write driver 700 and each resistive memory cell from which data is to be read is reduced, which, in turn, reduces a resistive load. Consequently, data can be sensed at increased speed.

Resistive memory 10 illustrated in FIG. 17 may use a different sensing scheme according to each resistive memory, which will be described with reference to FIGS. 20 through 30.

Figure 20:
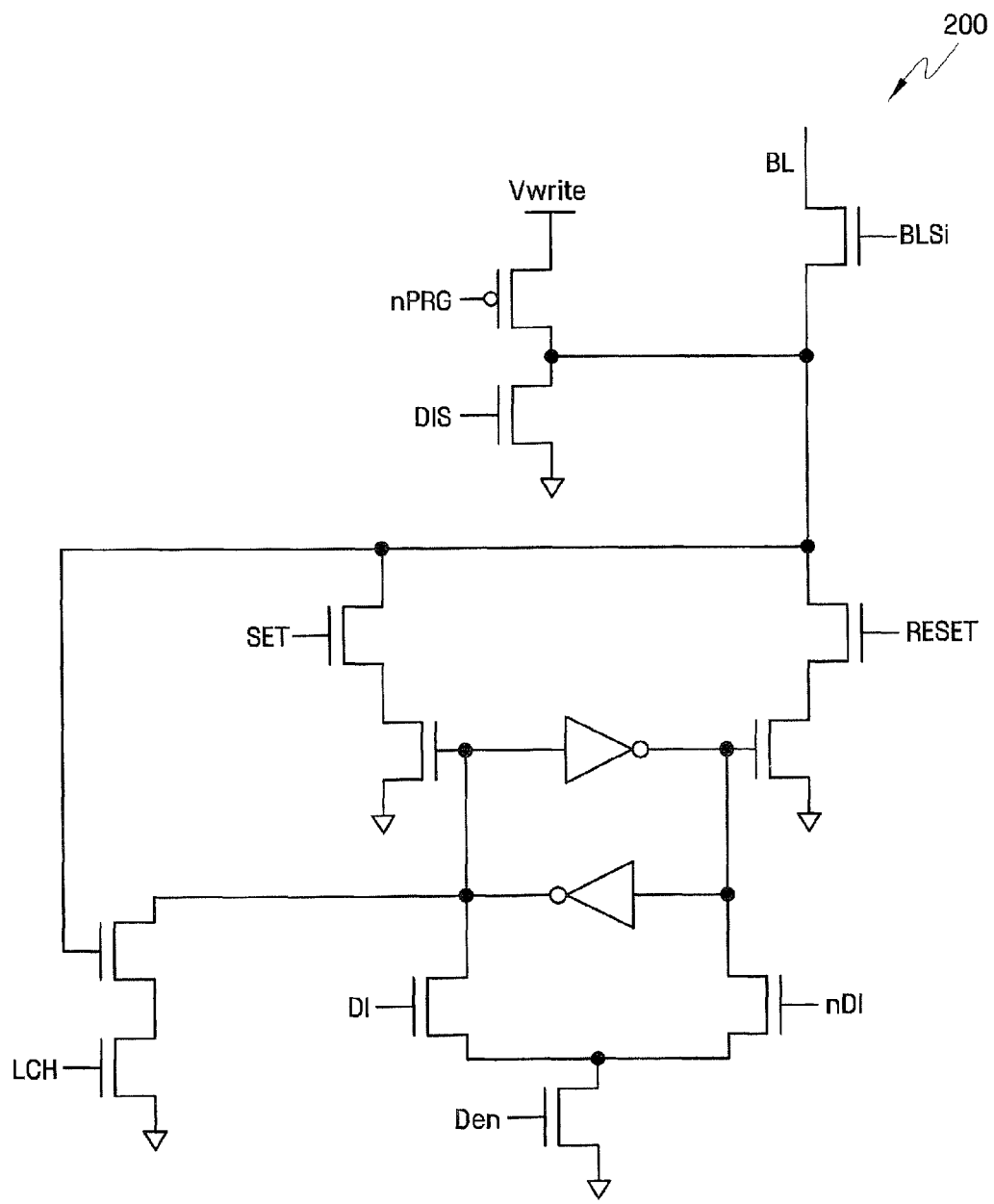
FIG. 20 is a circuit diagram of a cell of a sense amp & write driver used in a storage memory.

FIG. 20 is a circuit diagram of a cell of sense amp & write driver 200 used in storage memory 100 of FIG. 17.

Sense amp & write driver 200 used in storage memory 100 should be able to read or write a relatively large amount of data at a same time.

When high-density arrays 110 as a whole have a memory capacity of, e.g., 16 Gbits, sense amp & write driver 200 used in storage memory 100 may need to have cells of 4 to 16 Kbytes. Thus, each cell of sense amp & write driver 200 have a small size.

Referring to FIG. 20, a read sense amplifier and a write driver may be integrated with each other in each cell of sense amp & write driver 200. When two inverters illustrated in FIG. 20 each include one nMOS transistor and one pMOS transistor, 16 MOSFETs may be used to implement each cell of sense amp & write driver 200. Therefore, while each cell of sense amp & write driver 700 (see FIG. 27) used in RAM 600 or 601 includes 20 MOSFETs, each cell of sense amp & write driver 200 may include a smaller number of MOSFETs.

Figure 21:
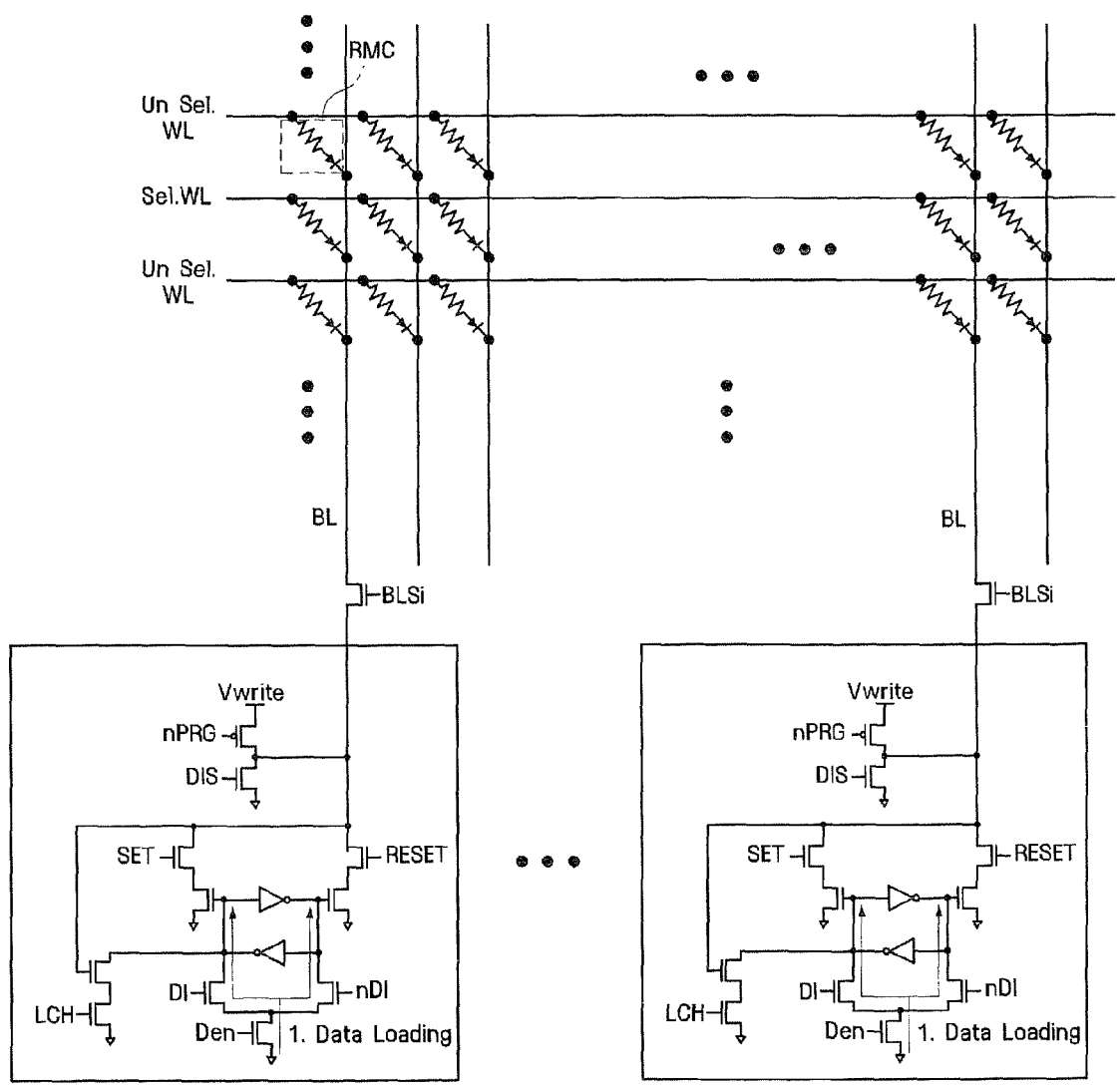
FIGS. 21 through 23 are circuit diagrams illustrating a write method used by the sense amp & write driver of FIG. 20.
Figure 22:
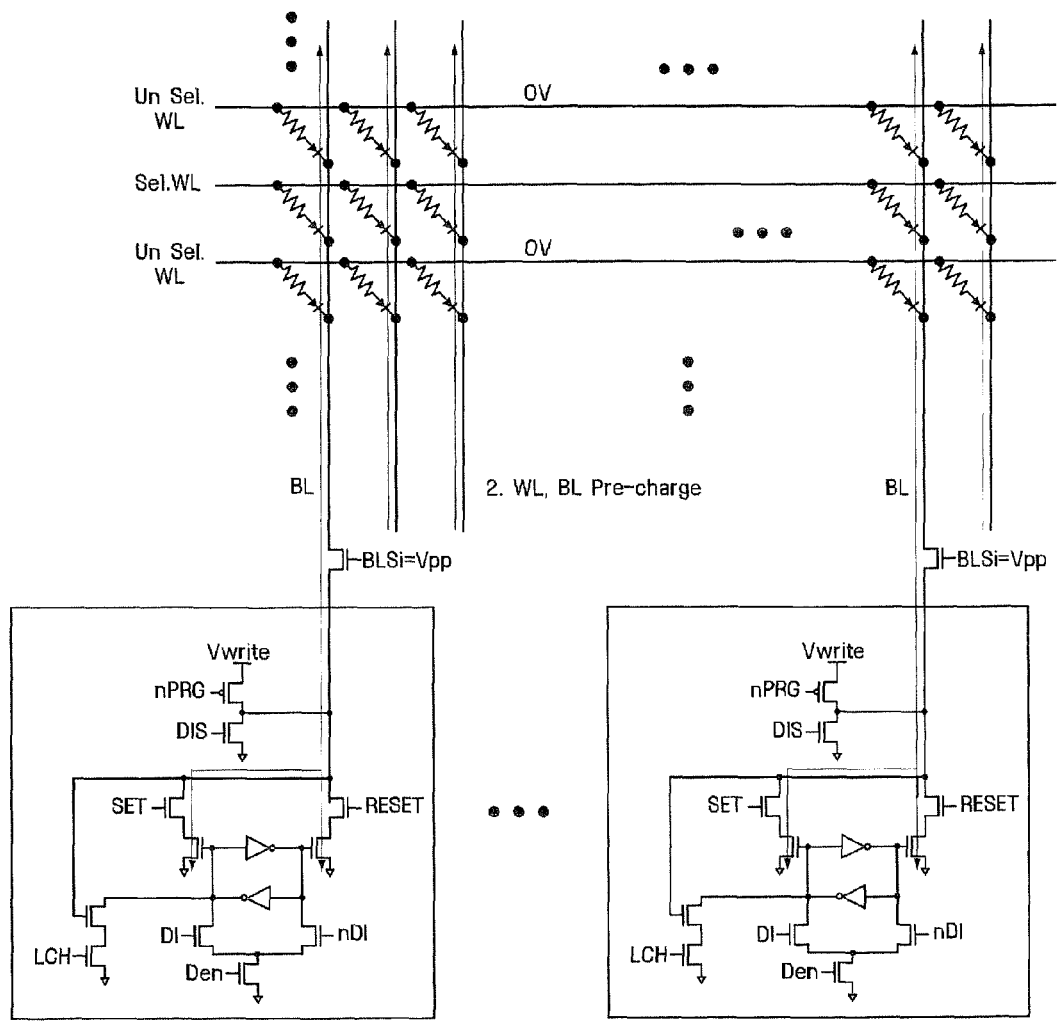
Figure 23:
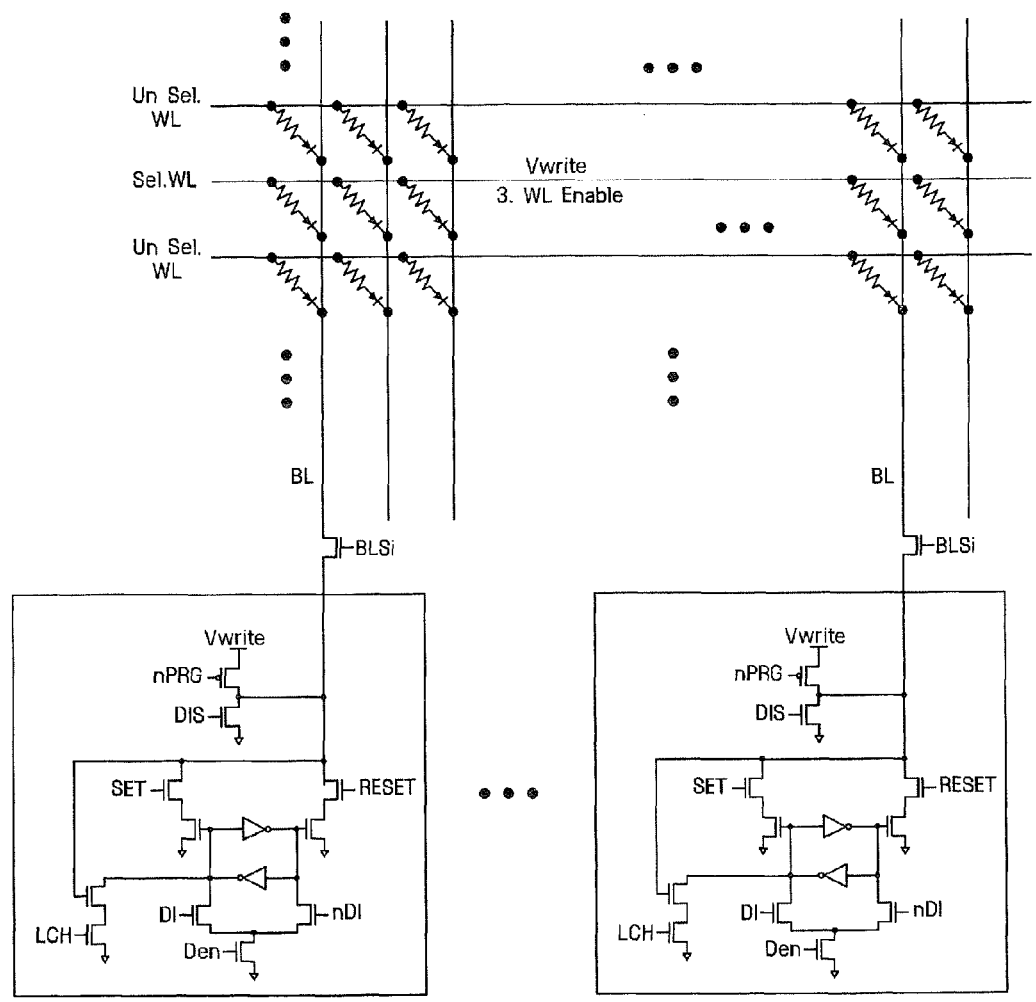

A write method used by sense amp & write driver 200 illustrated in FIG. 20 will now be described with reference to FIGS. 21 through 23. FIGS. 21 through 23 are circuit diagrams illustrating a write method used by sense amp & write driver 200 of FIG. 20. In FIG. 21, a plurality of bitlines BL, unselected wordlines UnSel. WL, a selected wordline Sel. WL, and a plurality of resistive memory cells RMC are illustrated. A variable resistance device and an access device included in each resistive memory cell RMC are represented respectively by a resistor and a diode which is connected in series with the resistor.

Referring to FIG. 21, an address of each variable resistive memory cell to which data is to be written is set up, a transistor Den is turned on, and data is stored in a latch through a transistor DI or nDI (data loading).

Referring to FIG. 22, selected wordline Sel. WL and a corresponding bitline BL are pre-charged. A voltage Vpp may be applied to a gate of a transistor BLSi, and a voltage of each wordline WL may become a ground voltage (e.g., 0 V) through a charge path illustrated in FIG. 22.

Referring to FIG. 23, a voltage applied to a gate of a transistor SET or RESET and a current flowing through a drain or source of the transistor SET or RESET are controlled to write data 0 or 1 (WL enable). Here, the voltage of the selected wordline Sel. WL may be Vwrite. After a recovery period, the write operation may be terminated.

Figure 24:
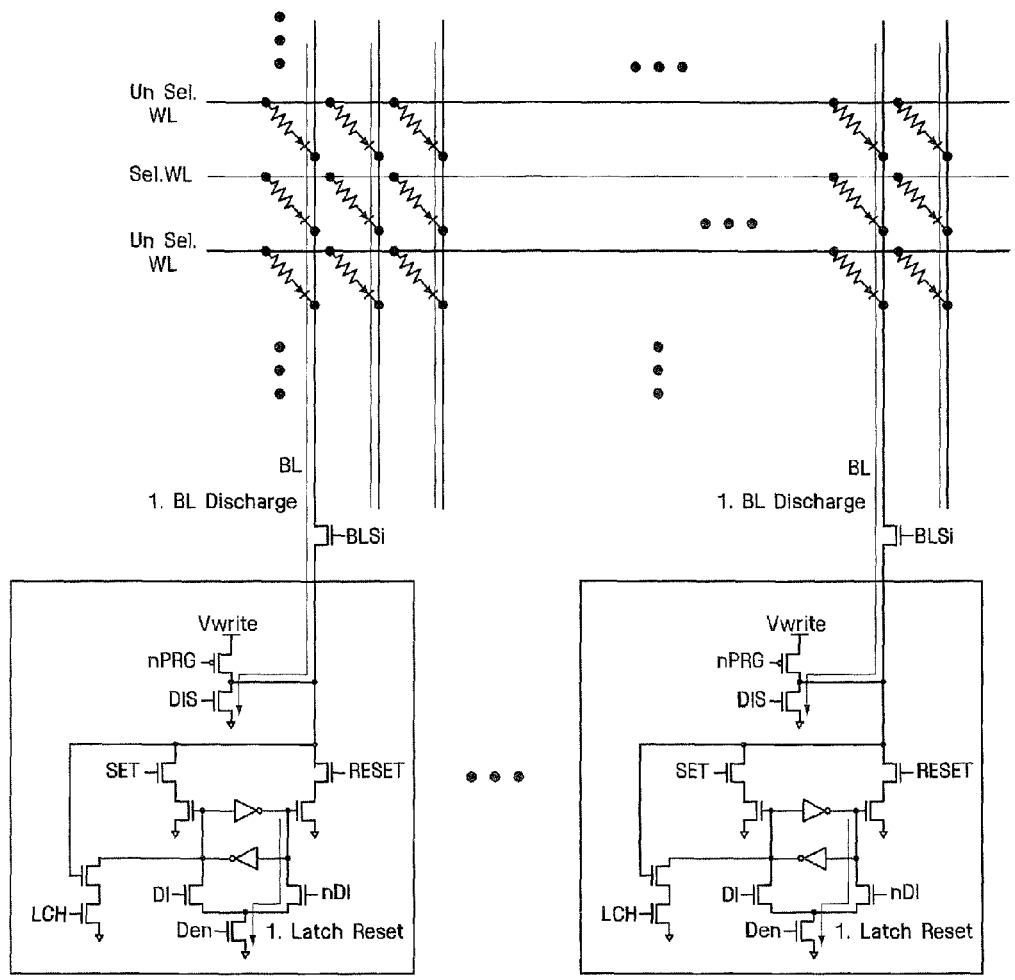
FIGS. 24 through 26 are circuit diagrams illustrating a read method used by the sense amp & write driver of FIG. 20.
Figure 25:
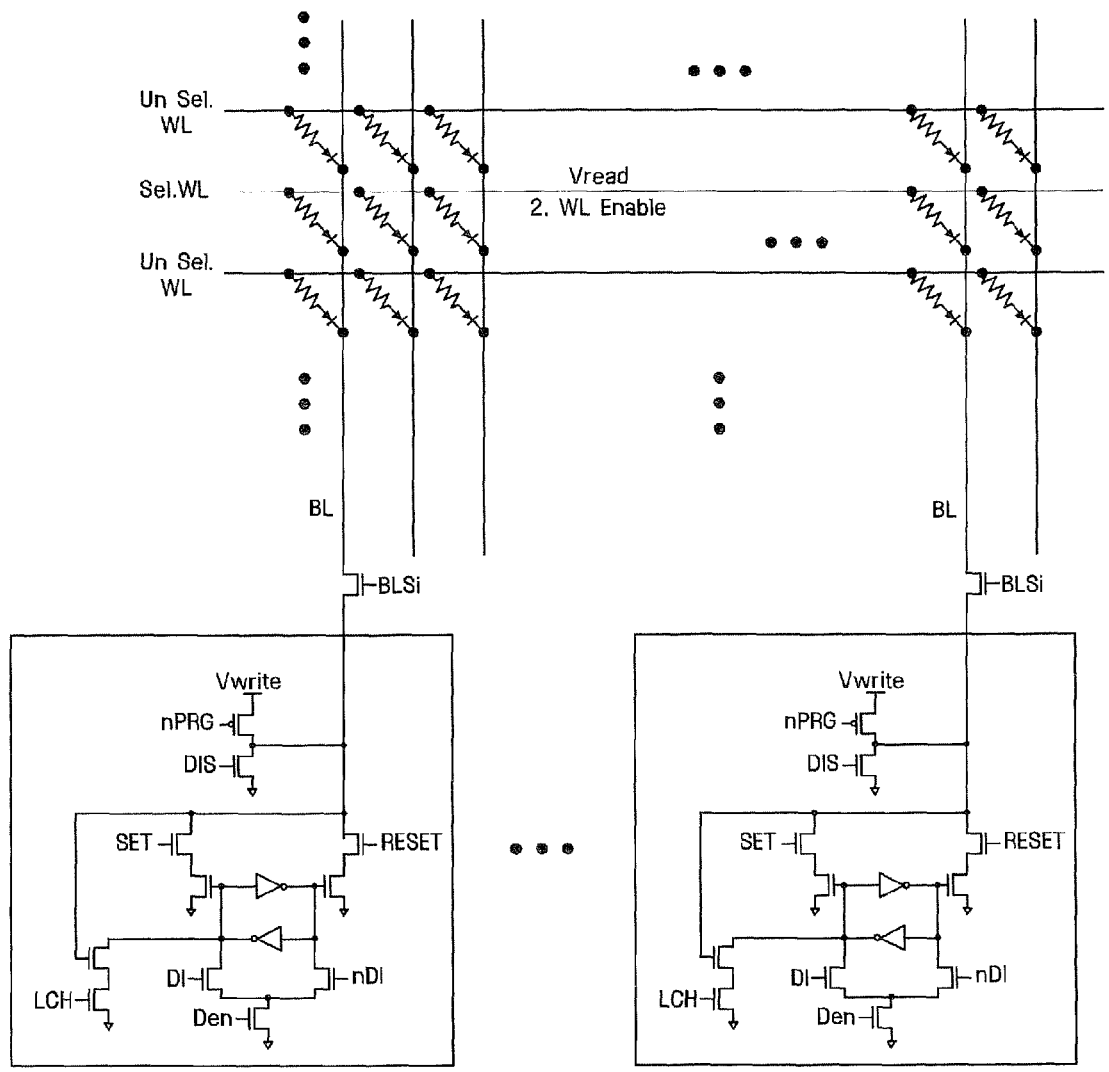
Figure 26:
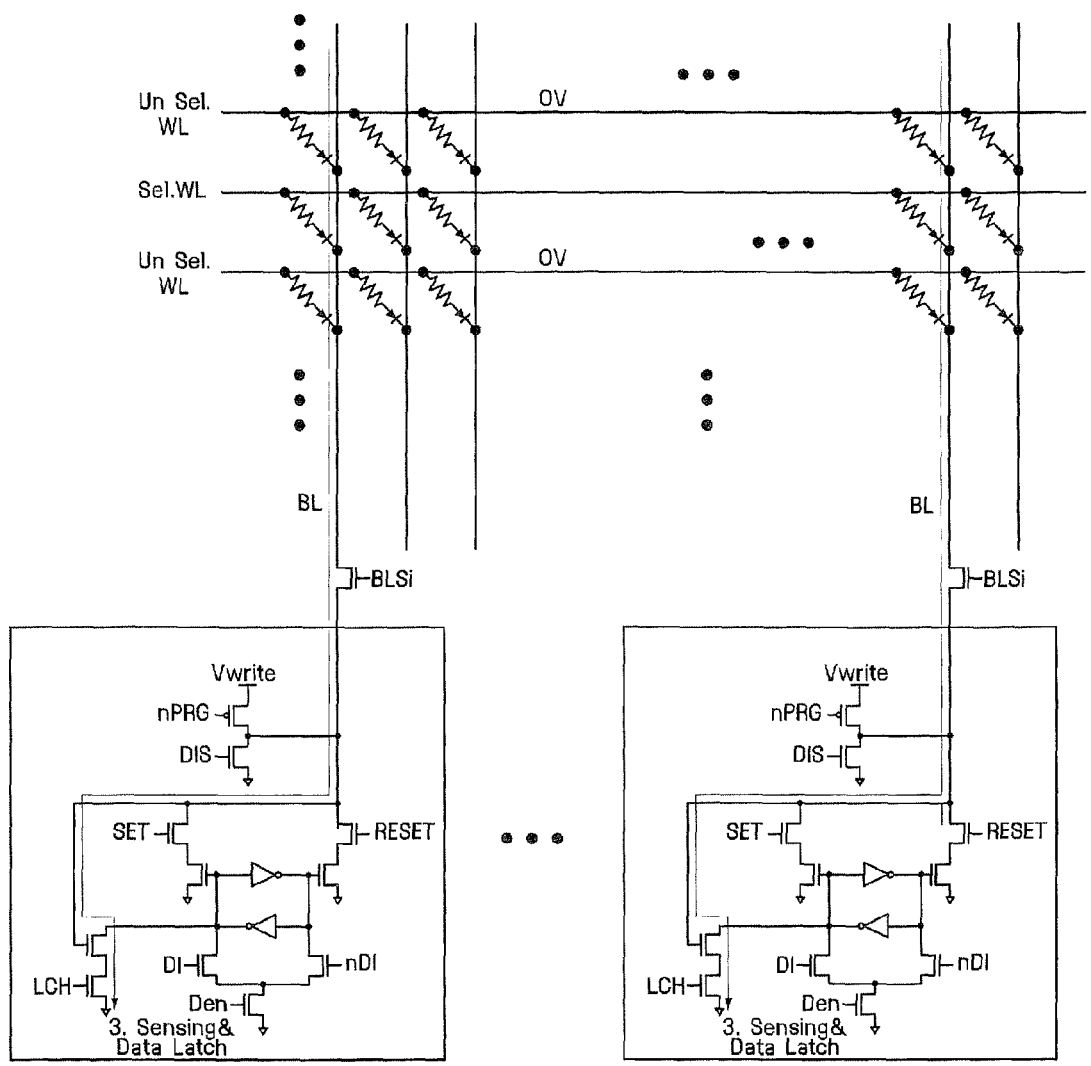

Sense amp & write driver 200 illustrated in FIG. 20 may read data by performing voltage sensing using a coupling ratio. A read method used by sense amp & write driver 200 illustrated in FIG. 20 will now be described in detail with reference to FIGS. 24 through 26. FIGS. 24 through 26 are circuit diagrams illustrating a read method used by sense amp & write driver 200 of FIG. 20.

Referring to FIG. 24, transistor Den is turned on, and the latch is reset using transistor nDI. In addition, a bitline is discharged through transistor DIS.

Referring to FIG. 25, a selected wordline Sel. WL is enabled, and bitline BL connected to a resistive memory cell from which data is to be read is developed. Here, the voltage of the selected wordline Sel. WL may be Vread.

Referring to FIG. 26, a voltage level is sensed, and data is latched. Specifically, a transistor BLSi, a transistor LCH, and a transistor connected in series with the transistor LCH are turned on. As a result, a closed loop is formed as indicated by an arrow in FIG. 26. Accordingly, a voltage level of the bitline BL connected to the resistive memory cell from which data is to be read is sensed, and the data is latched. The read operation may then be terminated.

Figure 27:
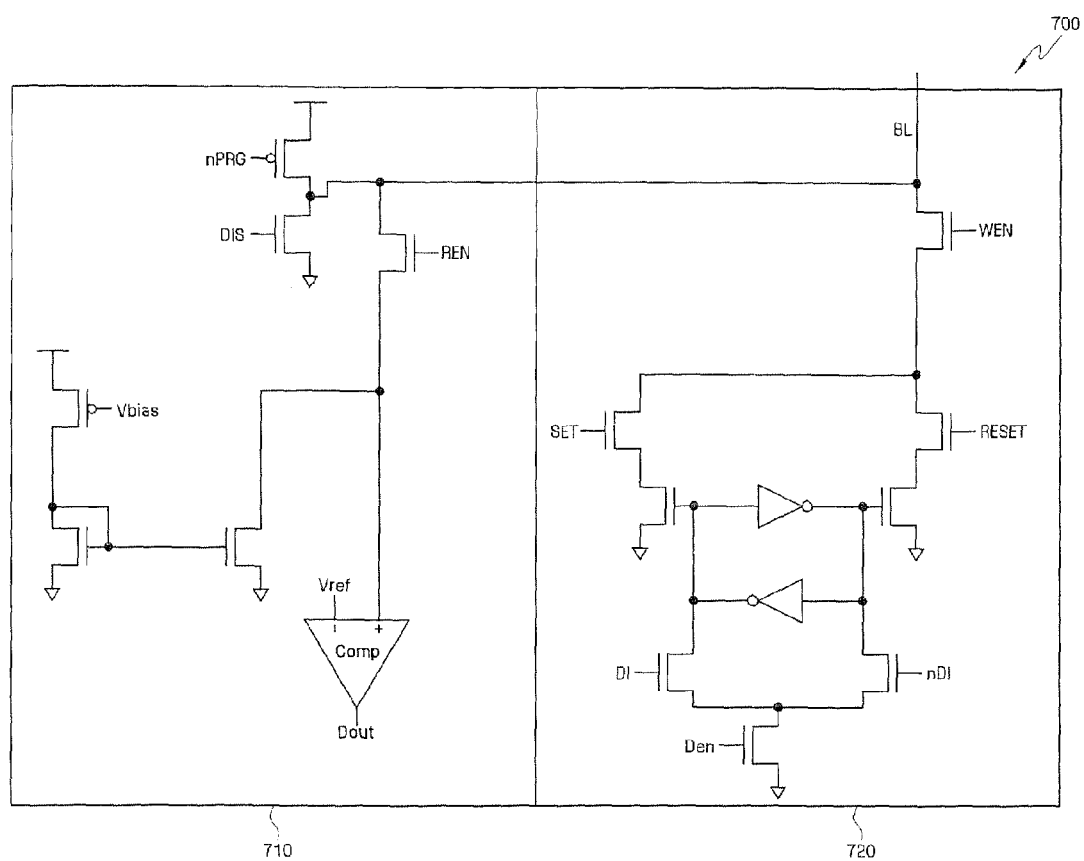
FIG. 27 is a circuit diagram of a cell of a sense amp & write driver used in the RAM.

FIG. 27 is a circuit diagram of a cell of sense amp & write driver 700 used in RAM 600 or 601. Sense amp & write driver 700 used in RAM 600 or 601 should be able to read data at high speed. When high-speed arrays 610 as a whole have a memory capacity of, e.g., 16 Mbits, sense amp & write driver 700 used in RAM 600 or 601 may need to have cells of 16 to 128 Kbytes.

Referring to FIG. 27, unlike sense amp & write driver 200 of FIG. 20, each cell of sense amp & write driver 700 may be divided into read sense amplifier 710 and write driver 720. When two inverters illustrated in FIG. 27 each include one nMOS and one pMOS, 20 MOSFETs may be used to implement each cell of sense amp & write driver 700.

A write method used by write driver 720 may be substantially identical to the write method used by sense amp & write driver 200 described above with reference to FIGS. 21 through 23, and thus a detailed description thereof will be omitted.

Figure 28:
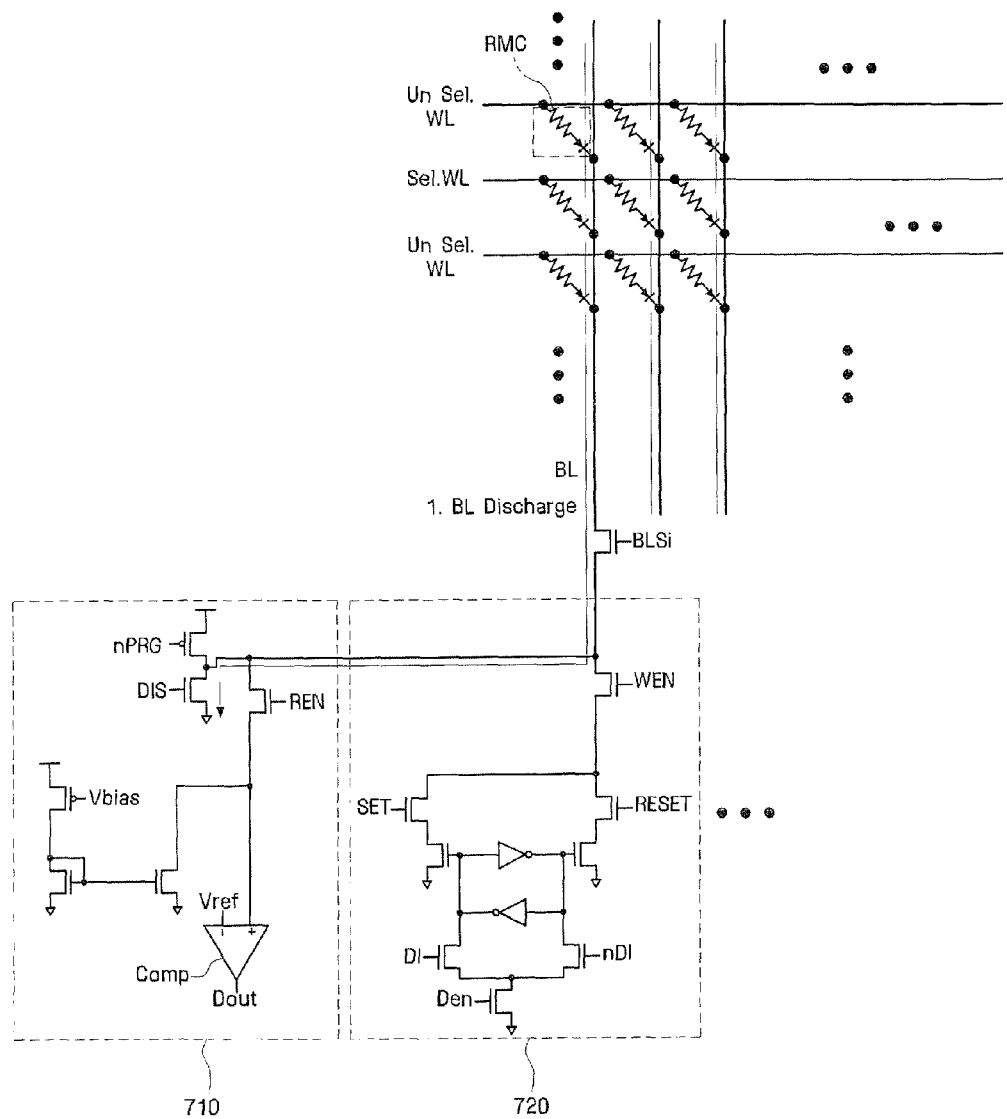
FIGS. 28 through 30 are circuit diagrams illustrating a read method used by a read sense amplifier of FIG. 27.
Figure 29:
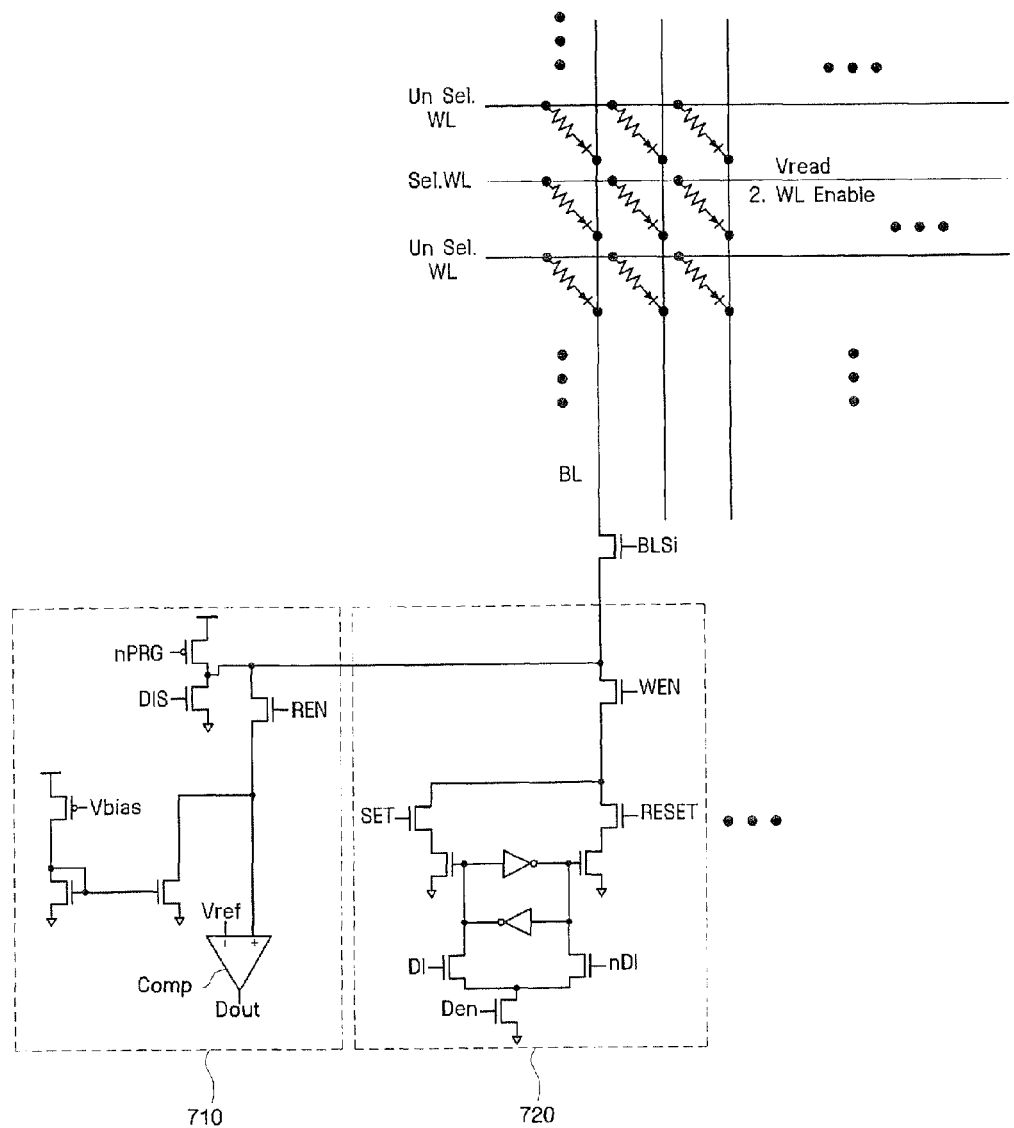
Figure 30:
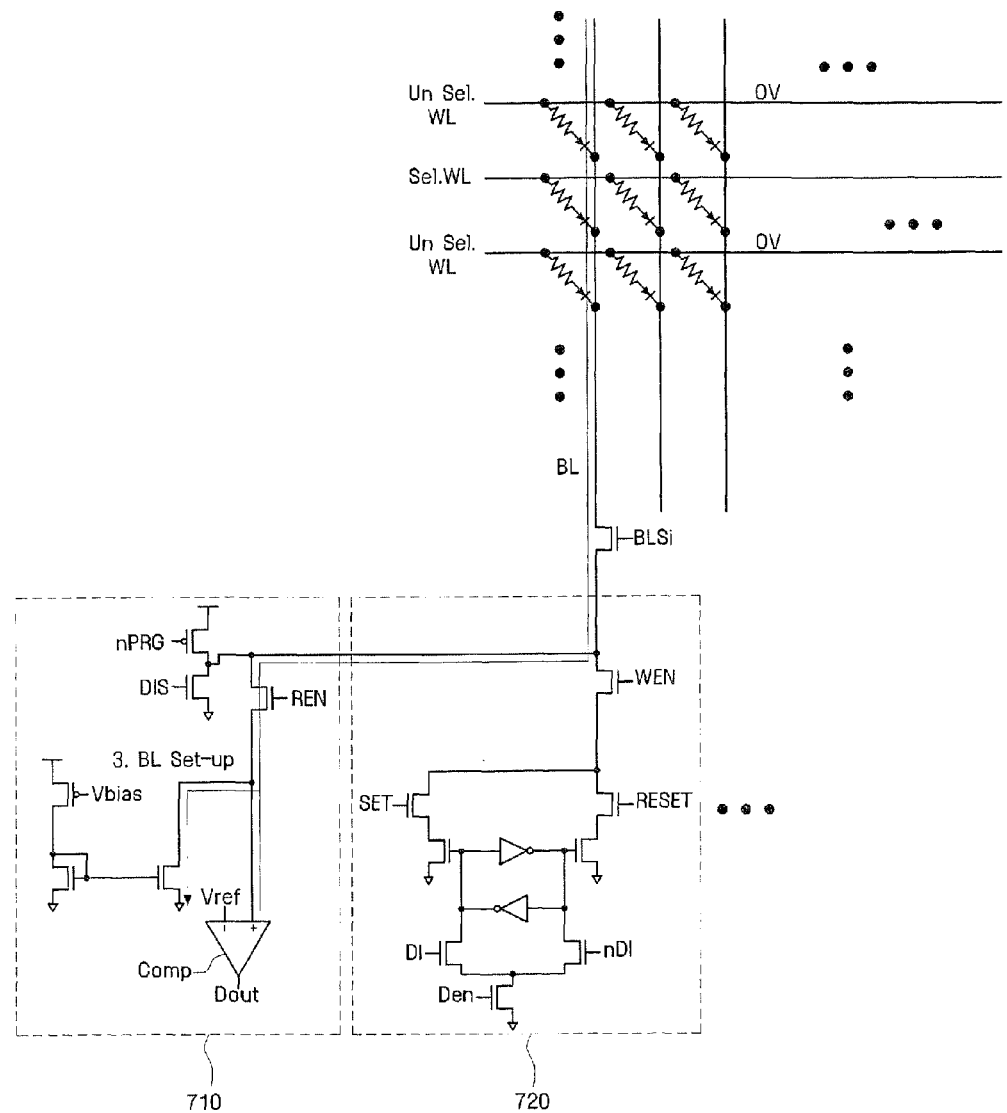

Read sense amplifier 710 illustrated in FIG. 27 may read data using current sensing. A read method used by read sense amplifier 710 illustrated in FIG. 27 will be described in detail with reference to FIGS. 28 through 30. FIGS. 28 through 30 are circuit diagrams illustrating a read method used by read sense amplifier 710 of FIG. 27.

Referring to FIG. 28, an address of each variable resistive memory cell from which data is to be read is set up, and a corresponding bitline BL is discharged through a transistor DIS.

Referring to FIG. 29, a selected wordline Sel. WL is enabled. Here, a voltage of a the selected wordline Sel. WL may be Vread.

Referring to FIG. 30, the bitline is set up, and data is output through a comparator Comp.

Specifically, a constant current may flow through a transistor Vbias having a gate to which a predetermined bias voltage is applied and a transistor which is connected in series to the transistor Vbias and whose gate and drain are connected to each other. In addition, a variable current may flow through a transistor REN having a gate to which a read enable signal is transmitted and a transistor connected in series to the transistor REN. A magnitude of the variable current varies according to a resistance level of a resistive memory cell to be read. Accordingly, a magnitude of a voltage applied to a plus terminal of the comparator may be changed. The comparator Comp compares a voltage applied to its plus terminal with a reference voltage Vref applied to its minus terminal and outputs a logic high or low value through its output terminal Dout. The read operation may then be terminated.

Data can be read faster through current sensing described above than voltage sensing because current sensing may not require the development time which may be required in voltage sensing. When current sensing is performed as described above, a speed of reading data from RAM 600 or 601 may be increased.

Figure 31:
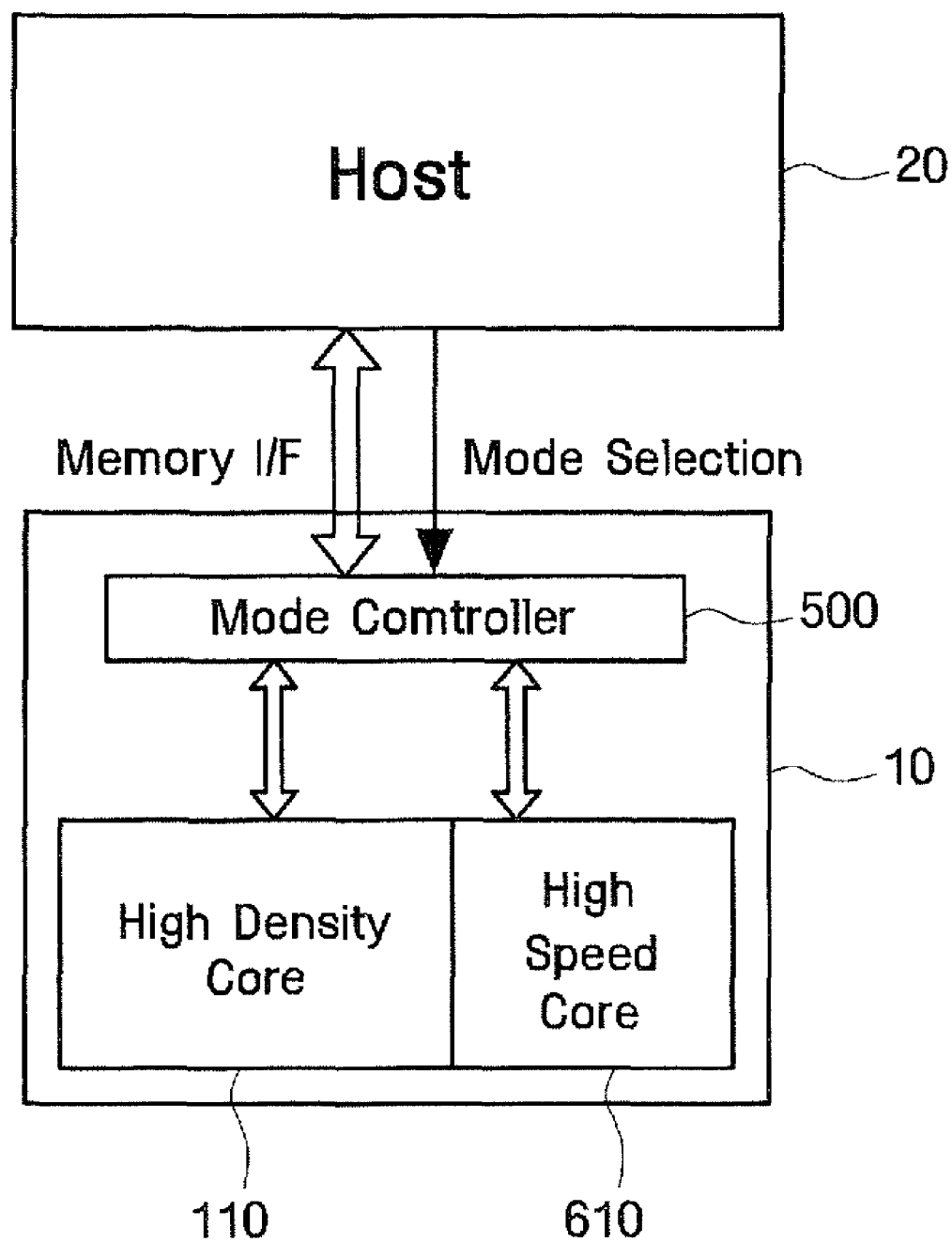
FIG. 31 is a block diagram of a memory interface included in the resistive memory chip according to some embodiments of the present invention.

A memory interface included in the resistive memory 10 of FIG. 1 or 17 will now be described with reference to FIG. 31. FIG. 31 is a block diagram of a memory interface included in resistive memory 10 of FIG. 1 or 17.

Resistive memory 10 may use a single access interface into which a storage access interface to access high-density arrays 110 and a random access interface to access high-speed arrays 610 may be physically integrated.

Referring to FIG. 30, resistive memory 10 may include one memory access interface in a physical aspect but operate as if it included two memory access interfaces in a logical aspect. More particularly, an access mode may be changed by controlling the data latency and data access speed of a mode controller 500 according to whether an address that the mode controller 500 is to access is an address of a variable resistive memory cell in high-density arrays 110 or an address of a variable resistive memory cell in high-speed arrays 610.

Alternatively, the access mode may be changed by changing a pin map. For example, when an address that the mode controller 500 is to access is an address of a variable resistive memory cell in high-density arrays 110, a pin map of the storage access interface may be used. When an address that mode controller 500 is to access is an address of a variable resistive memory cell in high-speed arrays 610, a pin map of the random access interface may be used.

In this way, when a host 20 accesses high-density arrays 110, the memory access interface may function as the storage access interface. When the host 20 accesses high-speed arrays 610, the memory access interface may function as the random access interface.

As described above, when only one memory access interface is physically included in resistive memory chip 10, not only an address pin and a data pin but also a command pin and a control pin can be shared by the storage access interface and the random access interface. As a result, manufacturing costs can be reduced.

While the present invention has been particularly shown and described with reference to embodiments thereof, it will be understood by those of ordinary skill in the art that various changes in faun and details may be made therein without departing from the spirit and scope of the present invention as defined by the following claims.

That which is claimed is:

1. A variable resistance memory device comprising:
a first array of first variable resistance memory cells on an integrated circuit chip, wherein each of the first variable resistance memory cells is configured to store a first data value by maintaining a first electrical resistance and to store a second data value by maintaining a second electrical resistance, wherein the first and second data values are different and wherein the second resistance is greater than the first resistance; and
a second array of second variable resistance memory cells on the integrated circuit chip, wherein each of the second variable resistance memory cells is configured to store the first data value by maintaining a third electrical resistance and to store the second data value by maintaining a fourth electrical resistance, wherein the fourth resistance is greater than the third resistance and wherein the third resistance is less than the first resistance.

2. The variable resistance memory device according to claim 1 wherein the fourth resistance level is greater than the first resistance level and less than the second resistance level.

3. The variable resistance memory device according to claim 1 further comprising:
a decoder coupled to the first array of the first variable resistance memory cells and coupled to the second array of the second variable resistance memory cells wherein the decoder is configured to select variable resistive memory cells of the first and second arrays for read and write operations.

4. The variable resistance memory device according to claim 1 wherein the first array of the first variable resistance memory cells has a higher density of variable resistance memory cells than the second array of the second variable resistance memory cells.

5. The variable resistance memory device according to claim 4 wherein the second array of the second variable resistance memory cells provide a higher access speed than the first array of the first variable resistance memory cells.

6. The variable resistance memory device according to claim 1 wherein each of the first variable resistance memory cells has a first cell area and wherein each of the second variable resistance memory cells has a second cell area different than the first cell area.

7. The variable resistance memory device according to claim 1 wherein each of the first variable resistance memory cells has a first cell height and wherein each of the second variable resistance memory cells has a second cell height different than the first cell height.

8. The variable resistance memory device according to claim 1 further comprising:
a sense amplifier and write driver coupled to the first array of the first variable resistance memory cells and to the second array of the second variable resistance memory cells.

9. The variable resistance memory device according to claim 8 further comprising:
a first selection switch coupled between a cell of the sense amplifier and write driver and a bit line of the first array of the first variable resistance memory cells; and
a second selection switch coupled between the cell of the sense amplifier and write driver and a bit line of the second array of the second variable resistance memory cells.

10. A variable resistance memory device comprising:
a high-density array of first variable resistance memory cells on an integrated circuit chip, wherein each of the first variable resistance memory cells has a first cell size;
a high-speed array of second variable resistance memory cells on the integrated circuit chip, wherein each of the second variable resistance memory cells has a second cell size different than the first cell size; and
a memory interface including a first interface configured to access the high-density array and a second interface configured to access the high-speed array, and wherein the first and second interfaces are physically integrated in the memory interface.

11. The variable resistance memory device according to claim 10 further comprising:
a mode controller coupled to the high-density and high-speed arrays wherein the mode controller is configured to control data latency and data access speed in accordance with an address of a variable resistive memory cell being accessed.

12. The variable resistance memory device according to claim 10 wherein the memory interface is configured to change between the first and second interfaces by changing a pin map of the memory interface according to an address of a variable resistance memory cell being accessed.

13. A variable resistance memory device comprising:
a first resistive memory array on an integrated circuit chip, wherein the first resistive memory array includes a first plurality of bitlines, a first plurality of wordlines, and a first plurality of variable resistance memory cells, wherein each of the variable resistance memory cells of the first plurality is electrically coupled between one of the first plurality of bitlines and one of the first plurality of wordlines;
a second resistive memory array on the integrated circuit chip, wherein the second resistive memory array includes a second plurality of bitlines, a second plurality of wordlines, and a second plurality of variable resistance memory cells, wherein each of the variable resistance memory cells of the second plurality is electrically coupled between one of the second plurality of bitlines and one of the second plurality of wordlines, wherein the first and second resistive memory arrays have different sizes; and
a sense amplifier configured to read data from the first resistive memory array using voltage sensing and to read data from the second resistive memory array using current sensing.

14. The variable resistance memory device according to claim 13 wherein the first resistive memory array includes a first X-decoder and a first Y-decoder, wherein the second resistive memory array includes a second X-decoder and a second Y-decoder, wherein the first X-decoder and the first Y-decoder are configured to select one of the first plurality of variable resistance memory cells for a read and/or write operation, and wherein the second X-decoder and the second Y-decoder are configured to select one of the second plurality of variable resistance memory cells for a read and/or write operation.

15. The variable resistance memory device according to claim 13 wherein first resistive memory array comprises a high-density array of the first plurality of variable resistance memory cells and wherein the second resistive memory array comprises a high-speed array of the second plurality of variable resistance memory cells, and wherein a number of the second plurality of variable resistance memory cells in the second resistive memory array is less than a number of the first plurality of variable resistance memory cells in the first resistive memory array.

16. The variable resistance memory device according to claim 13 wherein the first resistive memory array includes a first plurality of first sense amplifier and write driver cells wherein each first sense amplifier and write driver cell includes a read sense amplifier and a write driver, and wherein the second resistive memory array includes a second plurality of second sense amplifier and write driver cells wherein each second sense amplifier and write driver cell includes a read sense amplifier and write driver.

17. A variable resistance memory device comprising:
a first array of first variable resistance memory cells on an integrated circuit chip, wherein each of the first variable resistance memory cells has a first size;
a second array of second variable resistance memory cells on the integrated circuit chip, wherein each of the second variable resistance memory cells has a second size different than the first size;
a memory interface on the integrated circuit chip, wherein the memory interface includes a first interface configured to access the first array of the first variable resistance memory cells and a second interface configured to access the second array of the second variable resistance memory cells; and a mode controller configured to control a data latency and/or a data access speed in response to a mode selection signal.

18. The variable resistance memory device of claim 17 wherein the memory interface includes a pin map thereof, wherein the memory interface is configured to select one of the first memory interface or the second interface by changing the pin map responsive to a mode selection signal.

19. The variable resistance memory device of claim 17 wherein the first and second interfaces share an address pin, a data pin, a command pin, and a control pin.

* * * * *